(12) United States Patent
Ochi

(10) Patent No.: US 7,525,180 B2
(45) Date of Patent: Apr. 28, 2009

(54) SEMICONDUCTOR MOUNT SUBSTRATE, SEMICONDUCTOR DEVICE AND METHOD OF MANUFACTURING SEMICONDUCTOR PACKAGE

(75) Inventor: Takeo Ochi, Shiga (JP)

(73) Assignee: Panasonic Corporation, Osaka (JP)

( * ) Notice: Subject to any disclaimer, the term of this patent is extended or adjusted under 35 U.S.C. 154(b) by 250 days.

(21) Appl. No.: 11/583,900

(22) Filed: Oct. 20, 2006

(65) Prior Publication Data

US 2007/0090565 A1   Apr. 26, 2007

(30) Foreign Application Priority Data

Oct. 24, 2005 (JP) ............... 2005-307914
Aug. 25, 2006 (JP) ............... 2006-228510
Aug. 25, 2006 (JP) ............... 2006-228511

(51) Int. Cl.
*H01L 23/495* (2006.01)

(52) U.S. Cl. ............. 257/667; 264/272.11; 264/272.17; 425/572; 425/588; 257/670

(58) Field of Classification Search ............ 264/272.17, 264/272.11; 425/572, 588; 257/260, 667, 257/670

See application file for complete search history.

(56) References Cited

U.S. PATENT DOCUMENTS

| | | | | |
|---|---|---|---|---|
| 5,182,071 A | * | 1/1993 | Knapp et al. | 264/272.13 |
| 5,254,501 A | * | 10/1993 | Tung et al. | 29/827 |
| 5,302,101 A | * | 4/1994 | Nishimura | 425/116 |
| 5,886,398 A | * | 3/1999 | Low et al. | 257/667 |
| 6,013,947 A | * | 1/2000 | Lim | 257/685 |
| 6,649,447 B1 | * | 11/2003 | Chang et al. | 438/112 |
| 6,724,072 B2 | * | 4/2004 | Ochiai et al. | 257/667 |
| 6,797,542 B2 | * | 9/2004 | Kuratomi et al. | 438/112 |

FOREIGN PATENT DOCUMENTS

| | | |
|---|---|---|
| JP | 60-137049 | 7/1985 |
| JP | 60-152130 | 8/1985 |
| JP | 62-152130 | 7/1987 |
| JP | 03-116771 | 5/1991 |

* cited by examiner

*Primary Examiner*—David Vu
*Assistant Examiner*—Brandon Fox
(74) *Attorney, Agent, or Firm*—Steptoe & Johnson LLP

(57) ABSTRACT

Segments formed on a wiring substrate are arranged in a staggered array, and tie bars are provided between the segments.

27 Claims, 16 Drawing Sheets

SEMICONDUCTOR MOUNT SUBSTRATE, SEMICONDUCTOR DEVICE AND METHOD OF MANUFACTURING SEMICONDUCTOR PACKAGE

The present application claims priority to Japanese Patent Applications No. 2005-307914, filed Oct. 24, 2005, No. 2006-228510, filed Aug. 25, 2006 and No. 2006-228511, filed Aug. 25, 2006, the entire contents of which are expressly incorporated by reference.

FIELD OF THE INVENTION

The present invention relates to a semiconductor mount substrate, a semiconductor device and a method of manufacturing a semiconductor package and, more particularly, to a technique for a semiconductor package such as a ball grid array (BGA)

BACKGROUND OF THE INVENTION

In recent years, there has been a rapid progress in the development of semiconductor packages having an increased number of pins and a higher packaging density. In conventional semiconductor packages of this kind, lead-frame-type quad flat packages (QFPs) or the like have been in the mainstream but BGA packages using a substrate such as to have an advantage in terms of terminal density are now becoming mainstream.

In general, a BGA package manufacturing method in which a plurality of semiconductor devices are formed on one wiring substrate and are thereafter divided as individual semiconductor packages is in the mainstream. In recent years, multiarray-type wiring substrates on which a plurality of semiconductor devices are formed in two rows for the purpose of improving the productivity have been increased.

A BGA package technique of forming a plurality of semiconductor devices in two rows on a wiring substrate will be described. FIG. 21A shows an encapsulated state of semiconductor devices on a conventional wiring substrate, and FIG. 21B shows a state in which each semiconductor device is divided as an individual package. In FIGS. 21A and 21B, chips and wires in encapsulated portions are expressed in a see-through fashion.

In FIGS. 21A and 21B, reference numeral 1 denotes a frame (connecting portion), reference numeral 2 a segment in the front row (a region divided in correspondence with each package), reference numeral 3 a front-row tie bar, reference numeral 4 a runner to the front row, reference numeral 5 a segment in the rear row (a region divided in correspondence with each package), reference numeral 6 a rear-row tie bar, reference numeral 7 a runner to the rear row, reference numeral 8 an opening, reference numeral 9 a positioning pin hole, reference numeral 10 a divided BGA package, reference numeral 11 a chip (semiconductor device), reference numeral 12 a wire, reference numeral 13 a resin encapsulated portion, reference numeral 14 a gate, and reference numeral 15 a runner before divergence.

As shown in FIG. 21A, the semiconductor devices have the chips 11 mounted on the segments 2 and 5 in a state where the segments 2 and 5 are connected to the frame 1 of the wiring substrate S. Each chip 11 is connected to substrate electrodes by wires 12. The chip 11 and the wires 12 are encapsulated in a resin to form the resin encapsulated portion 13.

The resin encapsulated portion 13 is formed so as to be a notch smaller than the size of the segment. This is for the purpose of preventing the resin from leaking out from the segments 2 and 5 of the wiring substrate S. The sides of the resin encapsulated portions 13 are formed parallel to the sides of the segments 2 and 5 of the wiring substrate S.

The segments 2 and 5 and the resin encapsulated portions 13 are orderly formed in matrix form. The runners 4, 7, and 15 are arranged on the frame 1. The runners 4, 7, and 15 form resin supply paths to the portion 13 to be resin encapsulated in an encapsulation mold. In the following description, "runners 4, 7, and 15" and the resin encapsulated portions 13 refer to cavities in the resin encapsulation mold or the resin material set in the cavities.

The openings 8 provided around the periphery of each of the segments 2 and 5 surround the segment except for corner portions of the segments 2 and 5. The portion 13 to be resin encapsulated has a gate 14 at one corner.

When resin encapsulation is performed by using the encapsulation mold, the encapsulation resin enters a region inside the wiring substrate S from the outside of the substrate and advances through the runners 15 in a direction perpendicular to a substrate peripheral edge of the frame 1. The runners 15 bend through an angle of 45 degrees at the corners of the segments 2 and 5 as the runners 4 to the front row and the runners 7 to the rear row.

The encapsulation resin enters the gates 14 of the portions 13 to be resin encapsulated through the runners 4 to the front row and the runners 7 to the rear row. The portions 13 to be resin encapsulated on the segments 2 and 5 in the front and rear rows are simultaneously supplied with the encapsulation resin from the runners 4 and 7.

At the time of gate break, i.e., when the runners 4, 7, and 15 are separated from the resin encapsulated portions 13 after setting of the resin in the above-described arrangement, a moment about an axis perpendicular to the axes of the runners 15 or a moment about an axis parallel to the axes of the runners 15 acts of the runners 4, 7, and 15, thereby bending the runners 4 and 7 at the gates 14.

In the conventional BGA package and the wiring substrate for the package, however, there is a difference of 45 degrees between the angle at which the runners 4 and 7 extend into the segments 2 and 5 and the angle at which the runners 15 extend into the frame 1 of the wiring substrate S.

Further, the runner distance by which the runners 15 and 7 extend to the segments 5 in the rear row is increased and the runners 15 and 7 are in close contact with the wiring substrate S through the entire length thereof. Therefore, the force necessary for separating the runners 15 and 7 from the wiring substrate S at the time of gate break is large.

Therefore, large stress acts in the runners 4, 7, and 15 at the time of gate break and obliquely works on the joint surfaces between the runners 4 and 7 and the resin encapsulated portions 13, and there is a problem that the possibility of portions of the runners 4 and 7 remaining at the gates 14, the possibility of the resin encapsulated portions 13 being chipped and the possibility of separation of the resin encapsulated portions 13 are increased thereby.

A method of using an arrangement in which the runners 15 extending from the outside of the wiring substrate S into the frame 1 are extended straight to central portions of the segments 2 and 5 without bending at any halfway points.

However, this method has a problem that the encapsulation resin tends to flow mainly at a central position on each portion 13 to be resin encapsulated without sufficiently spreading out in the cavity of the encapsulation mold for forming the resin encapsulated portions 13 while flowing. If the size of the portions 13 to be resin encapsulated is large, the possibility of voids (resin unfilled portions) remaining at the two corners closer to each gate 14 is increased.

Limiting this phenomenon requires ensuring a condition for enabling the encapsulation resin to flow while sufficiently spreading out in the cavity of the encapsulation mold, i.e., in the portions 13 to be resin encapsulated. Ensuring this condition requires increasing the width of each runner flow path immediately before reaching the portion 13 to be resin encapsulated so that the gate 14 is formed broader. However, this method is impractical for the reason described below.

In ordinary cases, plating portions are formed in predetermined regions on a wiring substrate corresponding to runners in order to ensure smooth runner separation at the time of gate break. Therefore, expansion of the plating portions is required for forming the gate 14 broader. Disadvantageously, expansion of the plating portions results in a reduction in wiring area on the wiring substrate.

A technique for lead-frame packages such as one technique disclosed in Japanese Patent Laid-Open No. 60-137049 is known. In the art disclosed in this publication, a method is proposed in which the die boning angle is inclined through 45 degrees to reduce the resistance of wires and a chip to the flow of an encapsulation resin or reduce stress after setting of the resin. Also, a method of inclining segments through 45 degrees from the orientation of runners to enable an encapsulation resin to flow smoothly is proposed in the art disclosed in Japanese Patent Laid-Open No. 62-152130.

These proposed methods can be said to be more effective than the conventional ones if the encapsulation resin flow is considered.

However, these methods are not an optimum solution to the above-described problem relating to gate break, the problem that voids (resin unfilled portions) occur at corners of a resin encapsulated portion, and other problems. Another related technique disclosed in Japanese Patent Laid-Open No. 4-276414 is known in which runners extending from the outside into a wiring substrate are without bending them on the way linearly led to centers of module sections (cavities) forming resin encapsulated portions. Cuts are formed in the wiring substrate extending from an outer peripheral edge of the same to the module sections.

In this arrangement, the runners are formed at positions corresponding to the cuts at the time of resin encapsulation. Portions of these runners placed adjacent to the module sections in correspondence with gates are not joined to the wiring substrate. This structure prevents portions of the runners from remaining at the gates at the time of gate break or prevents chipping of the resin encapsulated portions or separation of the resin encapsulated portions from the wiring substrate.

In this structure, however, the runners are supported in a cantilever manner at the gate since they are not joined to the wiring substrate through the entire runner distance to the gates. If the runner distance is increased, a load on the long runner acts on the narrow cross section of the gate, and a weak supporting structure results.

Therefore, there is a problem that when a force is applied in an unexpected direction to the runners by an erroneous operation or the like during transport of a plurality of semiconductor devices having resin encapsulated portions formed on the wiring substrate from the resin encapsulation step to the next gate break step for example, there is a possibility of the runners being broken in an unintended condition.

DISCLOSURE OF THE INVENTION

In view of the above-described problems, an object of the present invention is to provide a semiconductor mount substrate and a semiconductor realizable by the simplest method, having improved gate breakability, free from occurrence of voids and suitable for multiarray design, and a manufacturing method using the semiconductor mount substrate and the semiconductor device.

To solve the above-described object, according to the present invention, there is provided a semiconductor mount substrate as a wiring substrate having a plurality of segments arranged at equal intervals in straight rows to form segment groups, a pair of the segment groups being arranged in parallel with each other, and an outer connecting portion placed along substrate peripheral edges to surround the segment group in the front row and the segment group in the rear row, a semiconductor mount area, internal terminals and external terminals being provided on each segment, the semiconductor mount substrate including a staggered array of the segments formed by half-pitch shifting the arrangement intervals of the segment group in the front row and the arrangement intervals of the segment group in the rear row from each other, rear-row tie bars provided between the segments in the front row to connect the segments in the rear row and the outer connecting portion, and front-row tie bars provided between the segments in the rear row to connect the segments in the front row and the outer connecting portion.

In the above-described arrangement, the runners formed on the front-row tie bars and the rear-row tie bars are connected in straight form to gates on portions to be resin encapsulated formed on the segments without being bent. As a result, stress caused in the runners at the time of gate break acts uniformly in portions of the gates along a direction perpendicular to the axes of the runners, thus improving gate breakability.

The segments in the front row and the segments in the rear row may be arranged in a staggered array to enable disposition of the rear-row tie bars between the segments in the font row and disposition of the front-row tie bars between the segments in the rear row. This arrangement makes it possible to efficiently lay out spaces necessary for the formation of tie bars and to improve the efficiency of use of the wiring substrate.

In the semiconductor mount substrate of the present invention, openings may separate the segments in the front row and the rear-row tie bars from each other and separate the segments in the rear row and the front-row tie bars from each other.

This arrangement reduces the number of tie bars to half of that required in the conventional art and thereby improves the efficiency of a cutting step for dividing the substrate into the segments.

In the semiconductor mount substrate of the present invention, the arrangement may be such that an intermediate connecting portion is provided between the segment group in the front row and the segment group in the rear row; openings are formed around each of the segments; the front-row tie bars and the rear-row tie bars are formed between the outer connecting portion and the segments and between the intermediate connecting portion and the segments; cuts are formed between the segments in the front row so as to extend from the substrate peripheral edge on one side to the intermediate connecting portion; and the rear-row tie bars connecting the segments in the rear row and the intermediate connecting portion are positioned on the axes of the cuts.

For a semiconductor device of the present invention, runners may be linearly arranged to apexes of the portions to be resin encapsulated, to enable the resin to flow smoothly from the gates into the portion to be resin encapsulated and to reduce voids. The peripheral sides of the portions to be resin encapsulated may be made parallel to the peripheral sides of the corresponding segments to maximize the size of the resin encapsulated portions with respect to the segments.

According to the present invention, there is provided a semiconductor device in which the resin encapsulated portion has a regular octagonal external shape, and the sides of the external shape of the resin encapsulated portion are inclined through 45 degrees from the peripheral sides of the segment or parallel to the peripheral edges of the segment.

In the above-described arrangement, the portion to be resin encapsulated is made octagonal to enable optimization of the size of the portion to be resin encapsulated with respect to the segments regardless of the angle between the sides of the segment and the substrate peripheral edge.

According to the present invention, there is also provided a semiconductor device in which the resin encapsulated portion has a pentagonal external shape, and in which the first apex of the resin encapsulated portion is positioned at the front-row tie bar and on the axis of the rear-row tie bar.

In the above-described arrangement, the portion to be resin encapsulated is made pentagonal and a resin injection port is provided at the first apex of the pentagonal shape, thereby enabling the resin from the gate to flow smoothly in the portion to be resin encapsulated. The resin flows from the apex of the pentagonal shape toward the first side opposite from the apex, so that the resin flow velocity is stabilized and the occurrence of removal of the wires by the resin flow and the occurrence of voids are reduced.

In the semiconductor device of the present invention, the resin encapsulated portion may have a resin injection port at the first apex, include an inflow regulation region having the resin injection portion and a filling region including the semiconductor element, and have a groove for sectioning between the inflow regulation region and the filling region, the groove extending through the entire width of the filling region in parallel with the substrate peripheral edge.

According to the present invention, there is also provided a semiconductor device in which the resin encapsulated portion has a hexagonal external shape; a first apex of the resin encapsulated portion and a second apex opposite from the first apex are positioned on the front-row tie bar and the axis of the rear-row tie bar; and the resin encapsulated portion has a resin injection port at the first apex and the air vent at the second apex, includes an inflow regulation region having the resin injection portion, a filling region including the semiconductor element and a vent region having the air vent, has a groove for sectioning between the inflow regulation region and the filling region, the groove extending through the entire width of the filling region in parallel with the substrate peripheral edge, and has a second groove for sectioning between the filling region and the vent region, the second groove extending through the entire width of the filling region in parallel with the substrate peripheral edge.

According to the present invention, there is also provided a semiconductor device has straight runners extending from the substrate peripheral edge to the resin encapsulated portions on the segments in the front and rear rows, wherein a short front-row runner is joined to the outer connecting portion and to the front-row tie bar, and a long rear-row runner corresponding to the cut is joined to the semiconductor mount substrate only at the intermediate connecting portion and the rear-row tie bar.

According to the present invention, there is provided a method of manufacturing a semiconductor package, including arranging plating areas on the front-row tie bars and the rear-row tie bars, the plating areas extending from the outer connecting portion to the segments, mounting semiconductor elements on the semiconductor mount areas on the segments, forming, on the plating areas, resin encapsulated portions in which the semiconductor elements are encapsulated, by using an encapsulation mold for forming straight runners on the plating areas, separating the runners from the segments and the resin encapsulated portions, and separating the segments from the semiconductor mount substrate.

The semiconductor package manufacturing method of the present invention may be as described below. A pair of the semiconductor mount substrates are placed in parallel with each other on the encapsulation mold, with the segment groups in the front rows on the two semiconductor mount substrates set inside; a plurality of pod plungers provided between the two semiconductor mount substrates are linearly arranged at equal intervals to form a pod plunger group; and a pair of the pod plunger groups are placed in parallel with each other in a staggered array while half-pitch shifting the arrangement intervals of the pod plungers in the two pod plunger groups from each other; the pod plungers in the first pod plunger group, the segments in the rear row on the first semiconductor mount substrate and the segments in the front row on the second semiconductor mount substrate are placed on a straight line; runners of equal runner distance are formed from the pod plungers to the portions to be resin encapsulated formed on the segments in the two rows; the pod plungers in the second pod plunger group, the segments in the rear row on the second semiconductor mount substrate and the segments in the front row on the first semiconductor mount substrate are placed on a straight line; and runners of equal runner distance are formed from the pod plungers to the portions to be resin encapsulated formed on the segments in the two rows.

According to the present invention, as described above, a BGA package having improved gate breakability and suitable for prevention of occurrence of voids and for multiarray design and a wiring substrate for the BGA package can be provided.

While straight components are shown for the present invention, it is not necessary required that the components be straight, as long as they do not depart from the scope ensuring the effects according to the object of the present invention. Curved elements may be taken in as portions of the components to reduced stress or improve the resin flow.

DESCRIPTION OF THE EMBODIMENTS

Embodiments of the semiconductor device of the present invention will be described with reference to the accompanying drawings. Effective functions according to the present invention can be performed not only on a substrate-type package but also on a lead-frame-type package. However, embodiments of the present invention will be described with respect to a substrate-type package with which the functions can be best exhibited.

First Embodiment

Figure 1A:
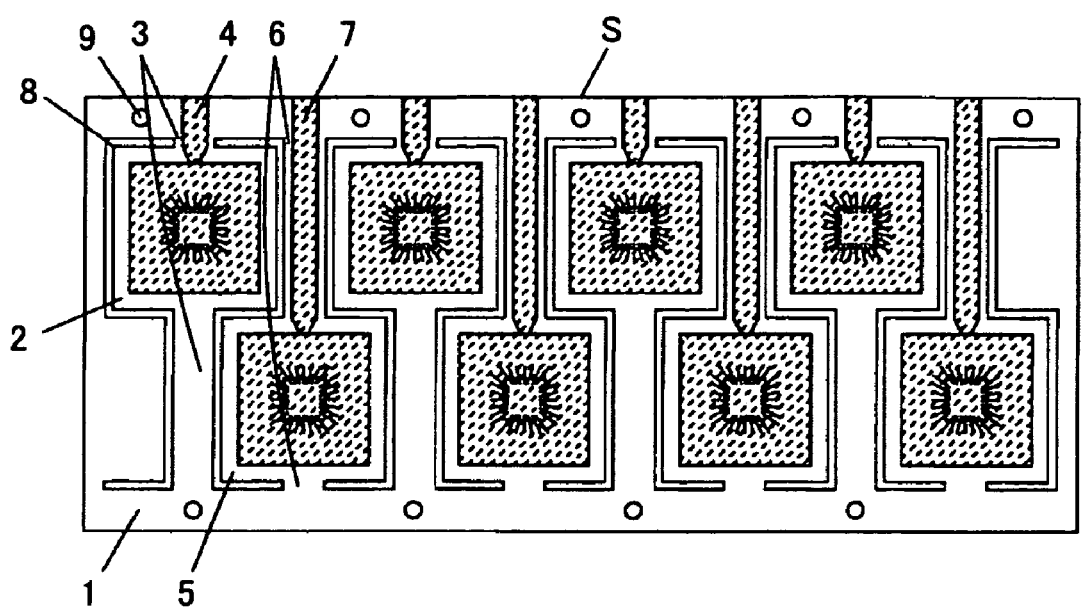
FIG. 1A is a diagram showing an encapsulated state of a BGA package on a semiconductor mounting substrate according to a first embodiment of the present invention.
Figure 1B:
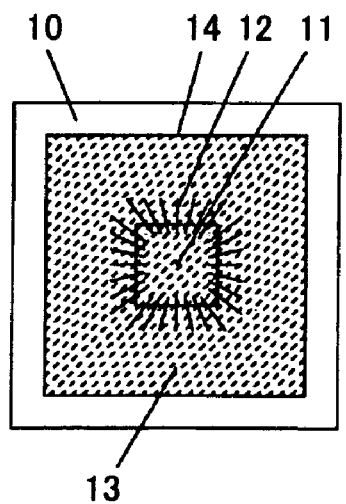
FIG. 1B is a diagram the BGA package after dividing into an individual piece.

FIG. 1A shows an encapsulated state of a BGA package according to a first embodiment of the present invention. FIG. 1B shows a divided BGA package. FIGS. 2A to 2E show a process of manufacturing the BGA package using a semiconductor mount substrate according to the first embodiment of the present invention.

In FIGS. 1 and 2A to 2E, reference character S denotes a semiconductor mount substrate, reference numeral 1 a frame (connecting portion), reference numeral 2 a segment in a front row (a region divided in correspondence with each package), reference numeral 3 front-row tie bars, reference numeral 4 a runner to the front row, reference numeral 5 a segment in a rear row (a region divided in correspondence with each package), reference numeral 6 rear-row tie bars, reference numeral 7 a runner to the rear row, reference numeral 8 an opening, reference numeral 9 a positioning pin hole, reference numeral 10 a divided BGA package, reference numeral 11 a chip (semiconductor device), reference numeral 12 a wire, reference numeral 13 a resin encapsulated portion, and reference numeral 14 a gate (resin injection port).

As shown in FIG. 1A, the semiconductor mount substrate S has a rectangular external shape, and a group of segments 2 and a group of segments 5 each having areas in square form are respectively arranged at equal intervals in straight rows, i.e., the front row and the rear row. The groups of segments in the front and rear rows are formed parallel to each other. The segments 2 in the group of segments in the front row and the segments 5 in the group of segments in the rear row are arranged in a staggered array such that their arrangement intervals are half-pitch shifted from each other.

Each of the segments 2 and 5 has a semiconductor mount area, internal terminals and external terminals. The frame 1 forming an outer peripheral connecting portion is placed so as to surround the first group of segments and the second group of segments.

The rear-row tie bars 6, that connect the segments 5 in the rear row and the frame 1, are disposed between the segments 2 in the group of segments in the front row. The front-row tie bars 3, that connect the segments 2 in the front row and the frame 1, are disposed between the segments 5 in the group of segments in the rear row.

On the front-row tie bars 3 and the rear-row tie bars 6, plating areas (not shown in the figures) extending from the frame 1 to the segments 2 and 5 are provided. The plating areas extend straight to the segments 2 and 5 without bending at any halfway points. The segments 2 in the group of segments in the front row and the rear-row tie bars 6 for the group of segments in the rear row are separated from each other by openings 8. Also, the front-row tie bars 3 for the group of segments in the front row and the segments 5 in the groups of segments in the rear row are separated from each other by other openings 8. The peripheral sides of the segments 2 and 5 are parallel to the substrate peripheral edges of the frame 1 of the semiconductor mount substrate S, and the sides of the external shape of the resin encapsulated portions 13 are parallel to the peripheral edges of the segments 2 and 5.

Figure 2A:
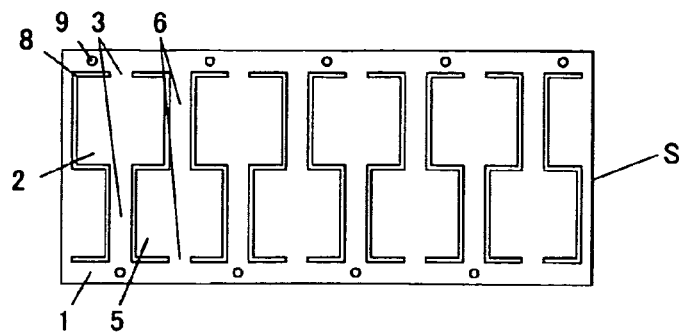
FIGS. 2A to 2E are diagrams showing a process of manufacturing the BGA package in the first embodiment.
Figure 2B:
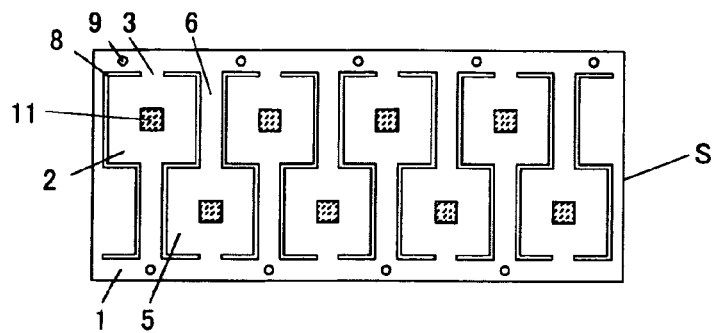

The BGA package using this semiconductor mount substrate S is manufactured by a process described below. As shown in FIG. 2B, chips 11 are die bonded to the segments 2 in the front row and to the segments 5 in the rear row on the wiring substrate S shown in FIG. 2A.

Figure 2C:
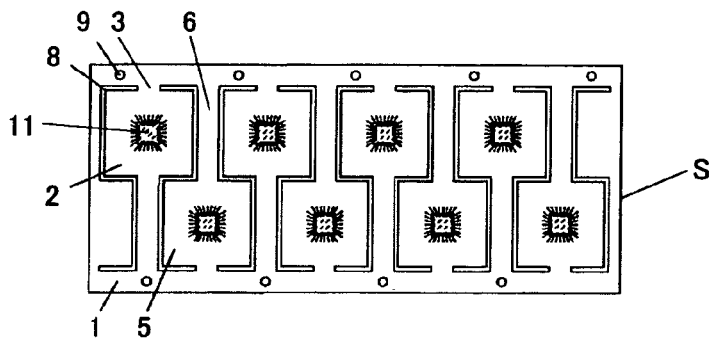
Figure 2D:
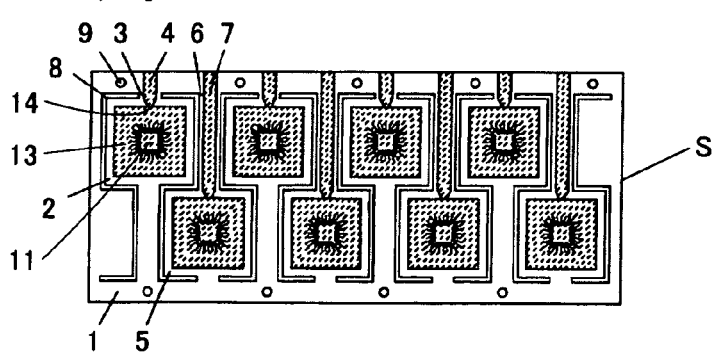

Subsequently, as shown in FIG. 2C, the chips 11 and electrodes of the segments 2 and 5 are connected to each other by wires 12. Resin encapsulated portions 13 are then formed by an encapsulation resin, as shown in FIG. 2D. The resin encapsulated portions 13 are formed by using an encapsulation mold having straight runner paths corresponding to the plating areas of the front-row tie bars 3 and the rear-row tie bars 6.

Figure 2E:
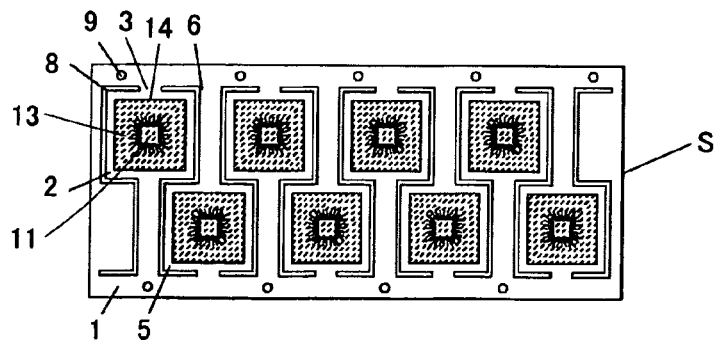

Subsequently, as shown in FIG. 2E, the runners 4 to the front row and the runners 7 to the rear row are removed from the frame 1 by gate break.

In the construction specific to the wiring substrate S of the first embodiment in the above-described process, the segments 2 in the front row and the segments 5 in the rear row are positioned in a staggered fashion such that their arrangement intervals are half-pitch shifted from each other; the rear-row tie bars 6 are placed between the segments 2 in the front row; the front-row tie bars 3 are placed between the segments 5 in the rear row; and each gate 14 is placed at a central position on one side of the external shape of the portion 13 to be resin encapsulated.

The above-described specific construction ensures that the runners 4 to the front row and the runners 7 to the rear row passing over the front-row tie bars 3 and rear-row tie bars 6 can reach the centers of the portions 13 to be resin encapsulated (portions to be molded) on the segments 2 and 5 by extending straight without bending at any halfway points, thus making it possible to smoothly inject the encapsulation resin into the portions 13 to be resin encapsulated.

At the time of gate break, i.e., when the runners 4 and 7 are separated from the resin encapsulated portions 13 by being bent at the gates 14, a moment about an axis perpendicular to the axes of the runners 4 and 7 acts of the runners 4 and 7.

The runners 4 and 7 formed on the front-row tie bars 3 and the rear-row tie bars 6 extend straight perpendicularly from the outer peripheral edge of the semiconductor mount substrate S on one side to be joined to the portions 13 to be resin encapsulated. The boundary surfaces between the runners 4 and 7 and the portions 13 to be resin encapsulated extend in a direction perpendicular to the axes of the runners 4 and 7, i.e., in a direction parallel to the outer peripheral edge of the substrate. Therefore, stress caused at the time of gate break acts uniformly at the boundary surfaces between the runners 4 and 7 and the resin encapsulated portions 13 in the direction perpendicular to the runners 4 and 7.

This action derives from the specific construction of the present invention. That is, in the semiconductor mount substrate S rectangular in external shape, the groups of segments in the front and rear rows are formed parallel to each other and the segments 2 and 5 are arranged in a staggered array, thereby enabling the rear-row tie bars 6 formed between the segments 2 in the front row and the front-row tie bards 3 formed between the segments 5 in the rear row to be formed in a direction perpendicular to the peripheral edges of the semiconductor mount substrate S.

As a result, the occurrence of portions of the runners 4 and 7 remaining at the gates 14, the occurrence of chipping of the resin encapsulated portions 13 and the occurrence of separation of the resin encapsulated portions 13 from the segments 2 and 5 can be reduced. After gate break, each package formed of the segment 2 or 5 and the resin encapsulated portion 13 is cut off from the frame 1, thus forming the BGA package 10.

Second Embodiment

Figure 3:
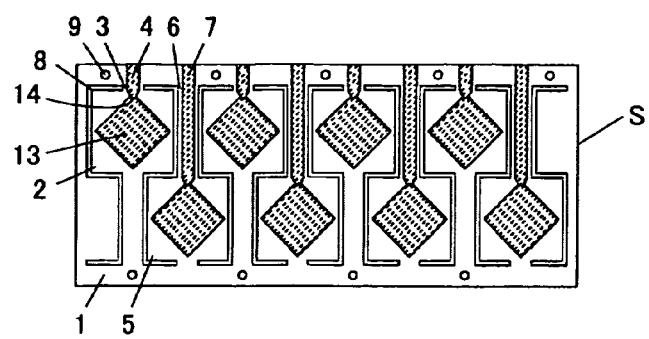
FIG. 3 is a diagram showing an encapsulated state of a BGA package according to a second embodiment of the present invention.

FIG. 3 shows an encapsulated state of a BGA package on a semiconductor mount substrate S in a second embodiment of the present invention. Referring to FIG. 3, the semiconductor mount substrate S is the same as that shown in FIG. 2A. The peripheral sides of segments 2 and 5 are formed parallel to the substrate peripheral edges of the frame 1. Chips 11 are mounted on the semiconductor mount areas of the segments 2 and 5, and resin encapsulated portions 13 in which the chips 11 are encapsulated are formed on the segments 2 and 5.

The sides of the external shape of each resin encapsulated portion 13 are inclined through 45 degrees from the peripheral sides of the segment 2 or 5. Each gate 14 is positioned at a center of one peripheral side of the segment 2 or 5 and at an apex of the resin encapsulated portion 13.

The above-described construction ensures that, at the time of gate break, i.e., when the runners 4 and 7 are cut off from the segments 2 and 5 and the resin encapsulated portions 13, stress acts uniformly at the boundary surfaces between the runners 4 and 7 and the resin encapsulated portions 13 in a direction perpendicular to the runners 4 and 7.

Therefore, improved gate breakability can be ensured. That is, the occurrence of portions of the runners 4 and 7 remaining at the gates 14, the occurrence of chipping of the resin encapsulated portions 13 and the occurrence of separation of the resin encapsulated portions 13 from the segments 2 and 5 can be reduced.

A further constructional feature resides in that the sides of each portion 13 to be resin encapsulated are inclined through 45 degrees from the sides of the segment 2 or 5; the gate 14 is positioned at one apex of the portion 13 to be resin encapsulated; and the two sides of the portion 13 to be resin encapsulated are connected to the gate 14 while maintaining angles of 45 degrees from the axes of the runner 4 or 7.

These two sides of the portion 13 to be resin encapsulated guide the encapsulation resin at the time of resin encapsulation, thereby reducing the possibility of occurrence of voids at the corners of the portion 13 to be resin encapsulated and enabling the encapsulation resin to be smoothly injected into the portion 13 to be resin encapsulated.

Also, the runners 4 and 7 can be formed in a straight shape to the gates 14. Therefore, there is no need to widen the plating areas corresponding to the runners 4 and 7, and the wiring areas on the segments 2 and 5 can be effectively utilized in comparison with the method of widening the runners 4 and 7 immediately before the gates.

Third Embodiment

Figure 4:
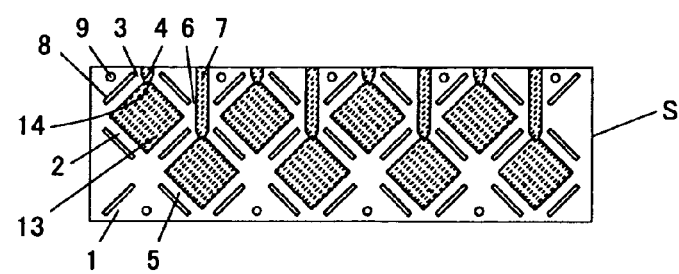
FIG. 4 is a diagram showing an encapsulated state of a BGA package according to a third embodiment of the present invention.

FIG. 4 shows an encapsulated state of a BGA package on a semiconductor mount substrate S in a third embodiment of the present invention. Referring to FIG. 4, the semiconductor mount substrate S is basically the same as that shown in FIG. 2A. A point of difference therefrom is as described below.

That is, each of segments 2 and 5 has such a shape that its peripheral sides are inclined through 45 degrees from the substrate peripheral edges of the frame 1. On the segments 2 and 5 are formed resin encapsulated portions 13 in which chips 11 are encapsulated while being mounted on the semiconductor mount areas of the segments 2, as are those in the above-described embodiments.

The sides of the external shape of each resin encapsulated portion 13 are inclined through 45 degrees from the substrate peripheral edges of the frame 1 and are parallel to the peripheral sides of the segment 2 or 5. Each gate 14 is positioned at one apex of the segment 2 or 5 and at one apex of the resin encapsulated portion 13.

The above-described construction ensures that, at the time of gate break, i.e., when the runners 4 and 7 are cut off from the segments 2 and 5 and the resin encapsulated portions 13, stress acts uniformly at the boundary surfaces between the runners 4 and 7 and the resin encapsulated portions 13 in a direction perpendicular to the runners 4 and 7, as in the first embodiment.

Therefore, the desired gate breakability of the runners 4 and 7 can be ensured. That is, the occurrence of portions of the runners 4 and 7 remaining at the gates 14, the occurrence of chipping of the resin encapsulated portions 13 and the occurrence of separation of the resin encapsulated portions 13 from the segments 2 and 5 can be reduced.

A further constructional feature resides in that each of the segments 2 and 5 has such a shape that its peripheral sides are inclined through 45 degrees from the substrate peripheral edges of the frame 1; the sides of each portion 13 to be resin encapsulated are inclined through 45 degrees from the substrate peripheral edges of the frame 1 and are parallel to the peripheral sides of the segment 2 or 5; and the gate 14 is positioned at one apex of the segment 2 or 5 and at one apex of the portion 13 to be resin encapsulated.

The two sides of the portion 13 to be resin encapsulated guide the encapsulation resin at the time of resin encapsulation, as are those in the second embodiment, thereby reducing the possibility of occurrence of voids at the corners of the portion 13 to be resin encapsulated and enabling the encapsulation resin to be smoothly injected into the portion 13 to be resin encapsulated.

Also, the runners 4 and 7 can be formed in a straight shape to the gates 14. Therefore, there is no need to widen the plating areas corresponding to the runners 4 and 7, and the wiring areas on the segments 2 and 5 can be effectively utilized in comparison with the method of widening the runners 4 and 7 immediately before the gates. Moreover, the external shape of each resin encapsulated portion 13 can be increased closer to the bounds of the segment 2 or 5.

In this embodiment, the positioning pin holes 9 can be placed in a marginal space inside the frame 1 placed around the periphery of the group of segments in the front row and the group of segments in the rear row and between the segments 2 and 5, so that the frame 1 can be minimized in size to effectively utilize the space on the substrate.

Fourth Embodiment

Figure 5:
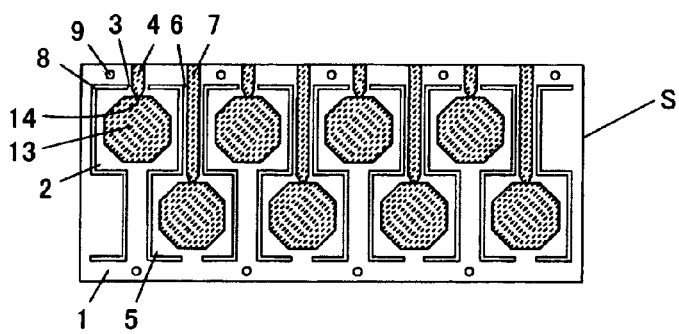
FIG. 5 is a diagram showing an encapsulated state of a BGA package according to a fourth embodiment of the present invention.

FIG. 5 shows an encapsulated state of a BGA package on a semiconductor mount substrate S in a fourth embodiment of the present invention. Referring to FIG. 5, the semiconductor mount substrate S is the same as that shown in FIG. 2A. The peripheral sides of segments 2 and 5 are formed parallel to the substrate peripheral edges of the frame 1. Chips 11 are mounted on the semiconductor mount areas, and resin encapsulated portions 13 in which the chips 11 are encapsulated are formed on the segments 2 and 5. Each resin encapsulated portion 13 has a regular octagonal external shape. Each gate 14 is positioned at a center of one peripheral side of the segment 2 or 5 and at a center of one side of the external shape of the resin encapsulated portion 13.

The above-described construction ensures improved gate breakability, as in the first embodiment. Also, each portion 13 to be resin encapsulated is formed in a regular octagonal shape to ensure that two sides of the portion 13 to be resin encapsulated guide the encapsulation resin in the vicinity of the gate 14 at the time of encapsulation so as to reduce the possibility of occurrence of voids at the corners of the portion 13 to be resin encapsulated and to enable the encapsulation resin to be smoothly injected into the portion 13 to be resin encapsulated.

Further, since each portion 13 to be resin encapsulated is formed in a regular octagonal shape, the size of the portion 13 to be resin encapsulated can be optimized with respect to the segment 2 or 5 regardless of the angle between the sides of the segment 2 or 5 and the substrate peripheral edges of the frame 1.

In the shape of the portion 13 to be resin encapsulated, the distance from the center of the segment 2 or 5 to the end is generally constant for the entire periphery. Therefore, the molding pressure is uniformly applied to the entire encapsulation area, and the possibility of occurrence of voids is reduced.

Fifth Embodiment

Figure 6:
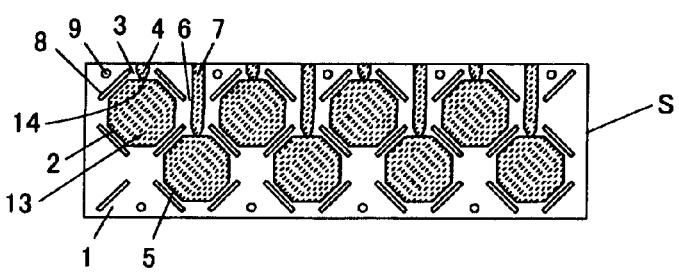
FIG. 6 is a diagram showing an encapsulated state of a BGA package according to a fifth embodiment of the present invention.

FIG. 6 shows an encapsulated state of a BGA package on a semiconductor mount substrate S in a fifth embodiment of the present invention. Referring to FIG. 5, the semiconductor mount substrate S is basically the same as that shown in FIG. 2A. A point of difference therefrom is as described below.

That is, each of segments 2 and 5 has such a shape that its peripheral sides are inclined through 45 degrees from the substrate peripheral edges of the frame 1. On the segments 2 and 5 are formed resin encapsulated portions 13 in which chips 11 are encapsulated, as are those in the above-described embodiments.

Each resin encapsulated portion 13 has a regular octagonal external shape, and the four sides of the external shape of the resin encapsulated portion 13 are parallel to the peripheral sides of the segment 2 or 5. Each gate 14 is positioned at a center of one peripheral side of the segment 2 or 5 and at a center of one side of the external shape of the resin encapsulated portion 13.

The above-described construction ensures improved gate breakability, as in the first embodiment. Also, each portion 13 to be resin encapsulated is formed in a regular octagonal shape to ensure that two sides of the portion 13 to be resin encapsulated guide the encapsulation resin in the vicinity of the gate 14 at the time of encapsulation so as to reduce the possibility of occurrence of voids at the corners of the portion 13 to be resin encapsulated and to enable the encapsulation resin to be smoothly injected into the portion 13 to be resin encapsulated.

Further, since each portion 13 to be resin encapsulated is formed in a regular octagonal shape, the size of the portion 13 to be resin encapsulated can be maximized with respect to the segment 2 or 5, as in the fourth embodiment. In the shape of the portion 13 to be resin encapsulated, the distance from the center of the segment 2 or 5 to the end is generally constant for the entire periphery. Therefore, the molding pressure is uniformly applied to the entire encapsulation area, and the possibility of occurrence of voids is reduced.

Sixth Embodiment

Figure 7:
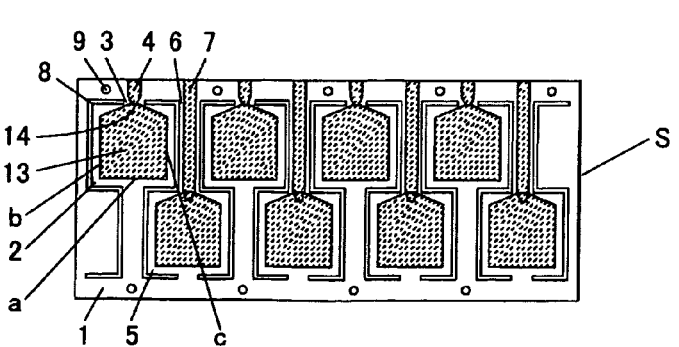
FIG. 7 is a diagram showing an encapsulated state of a BGA package according to a sixth embodiment of the present invention.

FIG. 7 shows an encapsulated state of a BGA package on a semiconductor mount substrate S in a sixth embodiment of the present invention. Referring to FIG. 7, the semiconductor mount substrate S is the same as that shown in FIG. 2A. The peripheral sides of segments 2 and 5 are formed parallel to the substrate peripheral edges of the frame 1. Chips 11 are mounted on the semiconductor mount areas, and resin encapsulated portions 13 in which the chips 11 are encapsulated are formed on the segments 2 and 5.

Each resin encapsulated portion 13 has a pentagonal external shape, and the gate 14 used at the time of resin encapsulation is placed at a first apex of the resin encapsulated portion 13. An air vent (not shown) is formed in a first side a of the resin encapsulated portion 13 opposite from the first apex and parallel to substrate peripheral edges of the frame 1. The first side a is perpendicular to a second side b and to a third side c. The second side b and the third side c are disposed parallel to each other.

The above-described construction ensures improved gate breakability, as in the first embodiment. Further, the encapsulation resin can be smoothly injected from the gate 14 through a path in the portion 13 to be resin encapsulated, which is not constricted, and two sides of the portion 13 to be resin encapsulated guide the encapsulation resin in the vicinity of the gate 14 to reduce the possibility of occurrence of voids at the corners. In the portion 13 to be resin encapsulated, the encapsulation resin moves straight to the air vent (not shown), so that the resin flow velocity is stabilized and easily controllable and the occurrence of voids and the occurrence of removal of the wires by the resin flow can be minimized.

Also, the runners 4 and 7 can be formed in a straight shape to the gates 14. Therefore, there is no need to widen the plating areas corresponding to the runners 4 and 7, and the wiring areas on the segments 2 and 5 can be effectively utilized in comparison with the method of widening the runners 4 and 7 immediately before the gates.

Seventh Embodiment

Figure 8A:
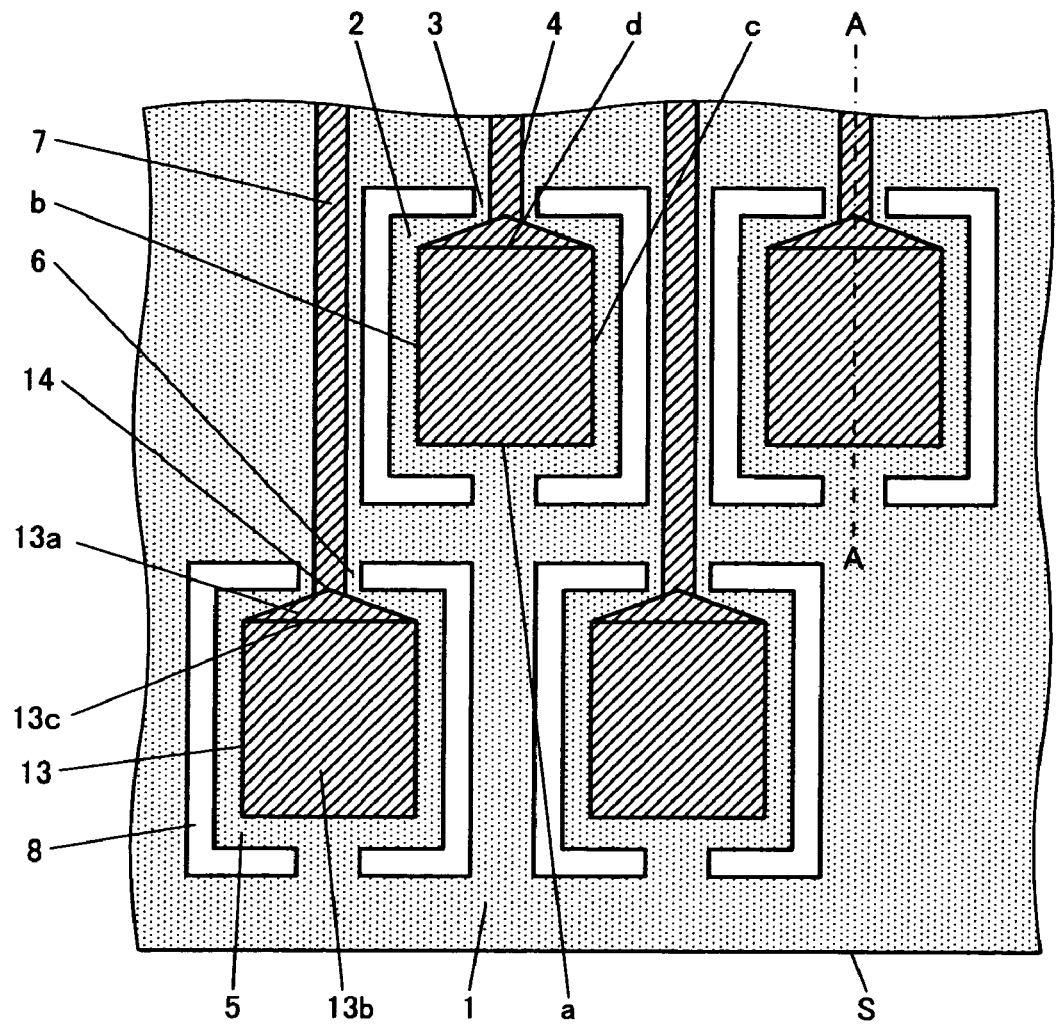
FIG. 8A is a diagram showing an encapsulated state of a BGA package on a semiconductor mounting substrate according to a seventh embodiment of the present invention.
Figure 8B:
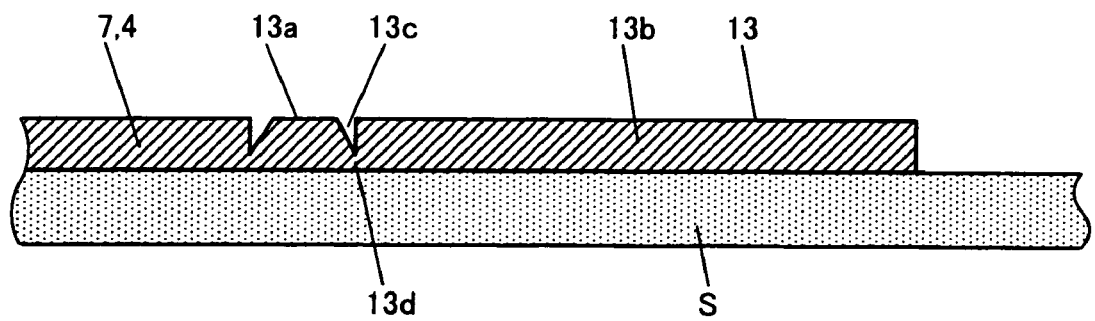
FIG. 8B is a sectional view taken along line A-A in FIG. 8A.

FIGS. 8A and 8B show an encapsulated state of a BGA package on a semiconductor mount substrate S in a seventh embodiment of the present invention. Referring to FIGS. 8A and 8B, the semiconductor mount substrate S is the same as that shown in FIG. 2A. The peripheral sides of segments 2 and 5 are parallel to the substrate peripheral edges of the frame 1. Chips 11 are mounted on the semiconductor mount areas, and resin encapsulated portions 13 in which the chips 11 are encapsulated are formed on the segments 2 and 5.

Each resin encapsulated portion 13 has an inflow regulation region 13a with a gate (resin injection port) 14 and a filling region 13b containing the chip 11, the regions 13a and 13b being sectioned by a groove 13c. The groove 13c is parallel to peripheral edges of the frame 1 of the semiconductor mount substrate S and extends through the entire width of the filling region 13b.

The inflow regulation region 13a has a triangular shape and the gate 14 is formed at a first apex (apex angle) of the triangular shape positioned on an axial line of the tie bar 3 or 6. The filling region 13b has a rectangular shape with a fourth side d opposed to the first apex and adjacent to the groove 13c. The fourth side d is parallel to the outer peripheral edges of the frame 1. An air vent (not shown) is formed in a first side a parallel to the fourth side d. Second and third sides b and c perpendicular to the first and fourth sides a and d are parallel to each other.

In the above-described construction, the path is made narrower at a position in the portion 13 to be resin encapsulated corresponding to the groove 13c to form a restriction 13d. The encapsulation resin injected through the gate 14 is temporarily retained in the inflow regulation region 13a and thereafter flows out of the restriction 13d into the filling region 13b. At this time, the encapsulation resin spreads out uniformly through the entire width of the restriction 13d, flows into the filling region 13b at a uniformly flow velocity and flows toward the air vent (not shown).

In this embodiment, therefore, improved gate breakability can be ensured, as in the first embodiment. The velocity of flow of the resin in the filling region 13b is made uniform by providing the restriction 13d, thus making it possible to minimize the occurrence of voids and the occurrence of removal of the wires by the resin flow.

Eighth Embodiment

Figure 9A:
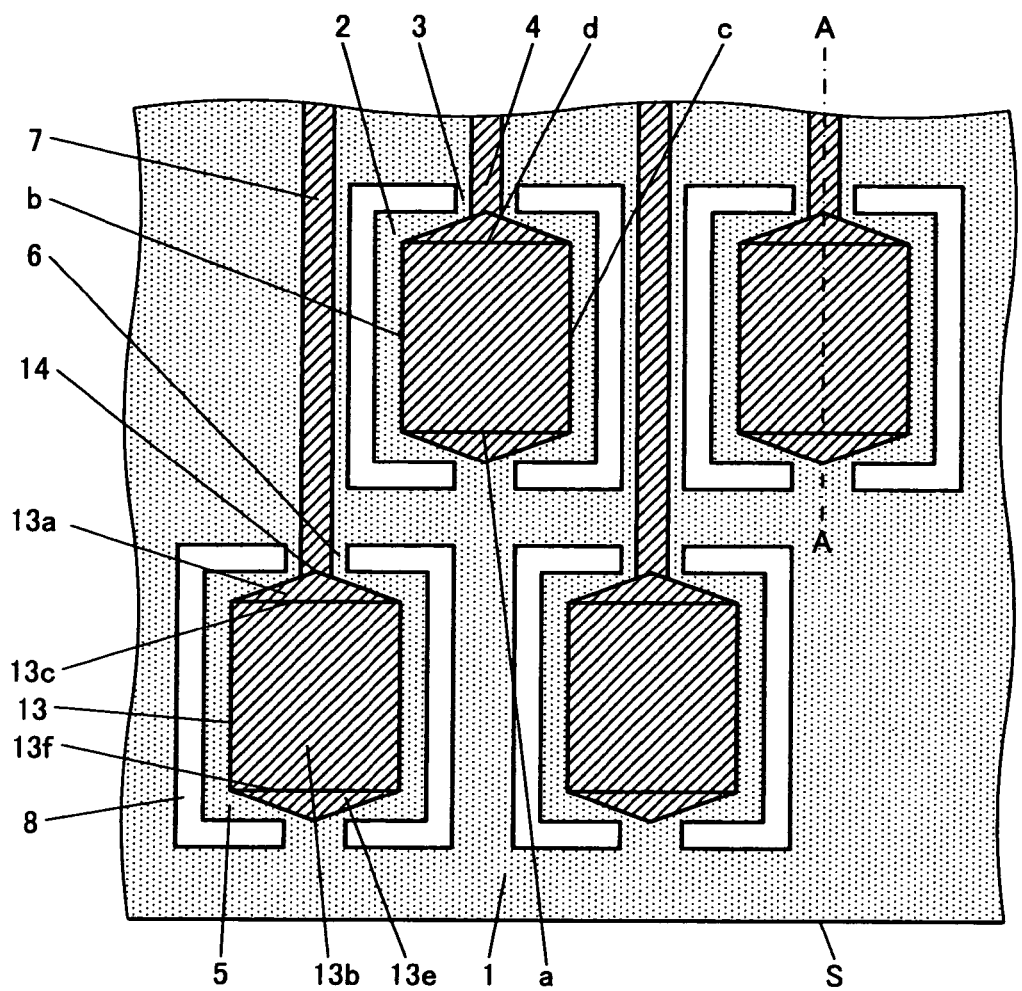
FIG. 9A is a diagram showing an encapsulated state of a BGA package on a semiconductor mounting substrate according to an eighth embodiment of the present invention.
Figure 9B:
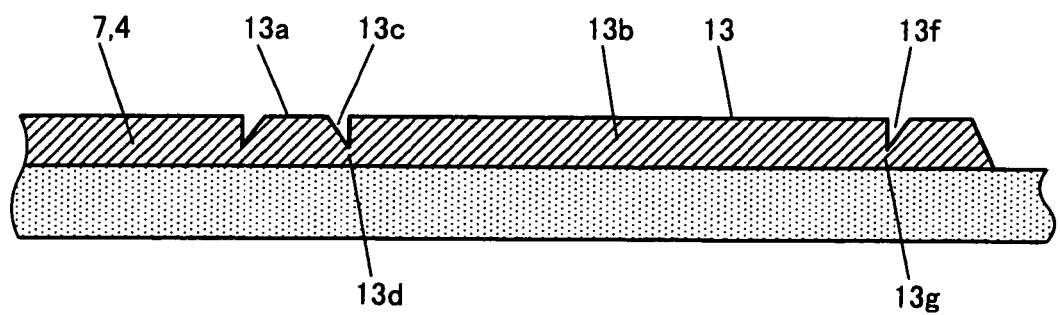
FIG. 9B is a sectional view taken along line A-A in FIG. 9A.

FIGS. 9A and 9B show an encapsulated state of a BGA package on a semiconductor mount substrate S in an eighth embodiment of the present invention. Referring to FIGS. 9A and 9B, the semiconductor mount substrate S is the same as that shown in FIG. 2A. The peripheral sides of segments 2 and 5 are parallel to the substrate peripheral edges of the frame 1. Chips 11 are mounted on the semiconductor mount areas, and resin encapsulated portions 13 in which the chips 11 are encapsulated are formed on the segments 2 and 5.

Each resin encapsulated portion 13 has a hexagonal external shape and has an inflow regulation region 13a with a gate 14 and a filling region 13b containing the chip 11, the regions 13a and 13b being sectioned by a groove 13c. The resin encapsulated portion 13 also has a vent region 13e with an air vent (not shown). The filling region 13b and the vent region 13e are sectioned by a second groove 13f.

The groove 13c and the second groove 13f are parallel to peripheral edges of the frame 1 of the semiconductor mount substrate S and extend through the entire width of the filling region 13b.

Each of the inflow regulation region 13a having a first apex and the vent region 13e having a second apex has a triangular shape. The first and second apexes of the inflow regulation regions 13a are positioned on the axes of the front-row tie bars 3 and the rear-row tie bars 6. Each gate 14 is provided at the first apex of the inflow regulation region 13a, and each air vent (not shown).

The filling region 13b has a rectangular shape with a fourth side d opposed to the first apex of the inflow regulation region 13a, and parallel to the substrate peripheral edges of the frame 1. A first side a adjacent to the second groove 13f is parallel to the fourth side d. Also, second and third sides b and c perpendicular to the first and fourth sides a and d are parallel to each other.

In the above-described construction, the path is made narrower at a position in the portion 13 to be resin encapsulated corresponding to the groove 13c to form a restriction 13d. The encapsulation resin injected through the gate 14 is temporarily retained in the inflow regulation region 13a and thereafter flows out of the restriction 13d into the filling region 13b. At this time, the encapsulation resin spreads out uniformly through the entire width of the restriction 13d, flows into the filling region 13b at a uniformly flow velocity and flows toward the vent region 13e.

The path is also made narrower at a position in the portion 13 to be resin encapsulated corresponding to the second groove 13f to form a second restriction 13g. Air in the filling region 13b flows out of the second constriction 13g into the vent region 13e. At this time, the air spreads out uniformly through the entire width of the second restriction 13g, flows into the vent region 13e at a uniformly flow velocity and flows toward the air vent (not shown).

In this embodiment, therefore, improved gate breakability can be ensured, as in the first embodiment. Further, the velocity of flow of the resin in the filling region 13b is made uniform to minimize the occurrence of voids and the occurrence of removal of the wires by the resin flow. Also, air can be finally expelled through one air vent while maintaining uniform flowage of air in the filling region 13b, thus making it possible to reduce the cost required to form a plurality of air vents in the conventional art.

Ninth Embodiment

Figure 10A:
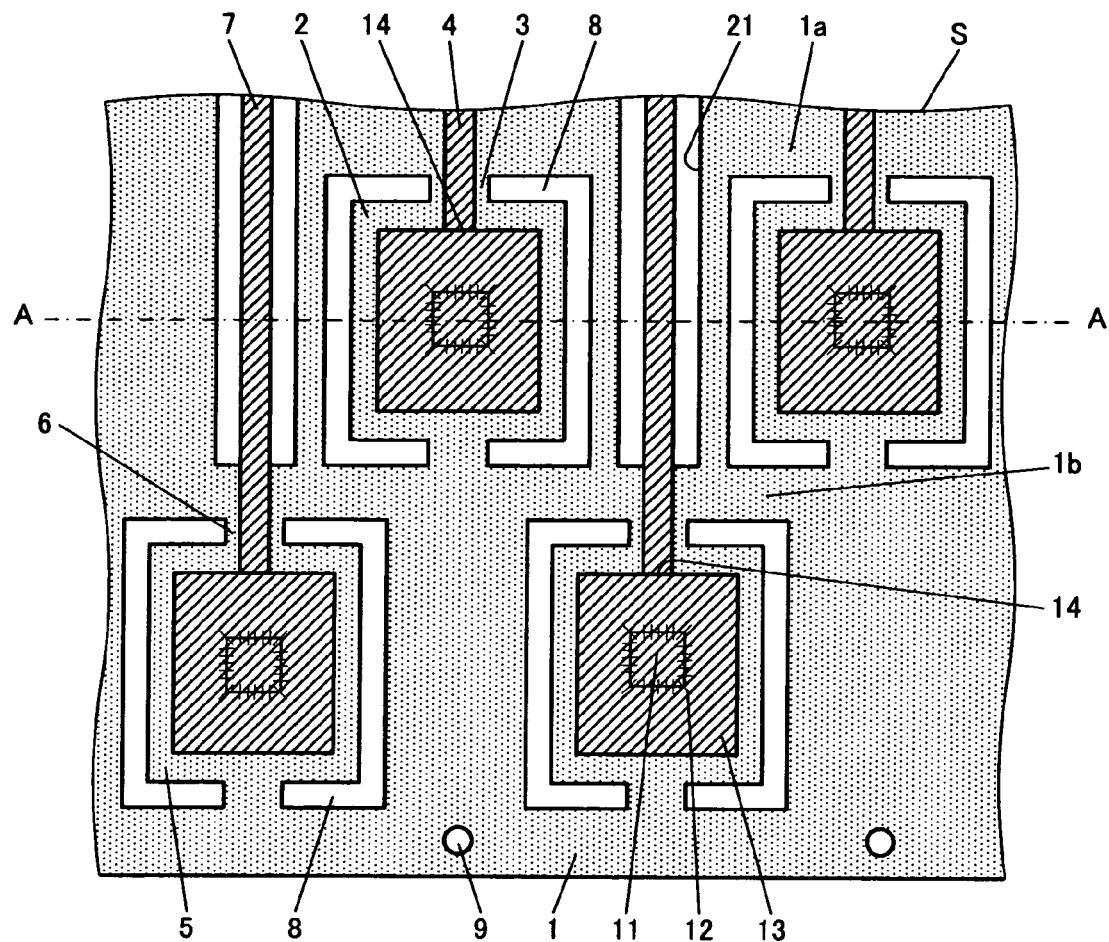
FIG. 10A is a diagram showing an encapsulated state of a BGA package according to an ninth embodiment of the present invention.
Figure 10B:
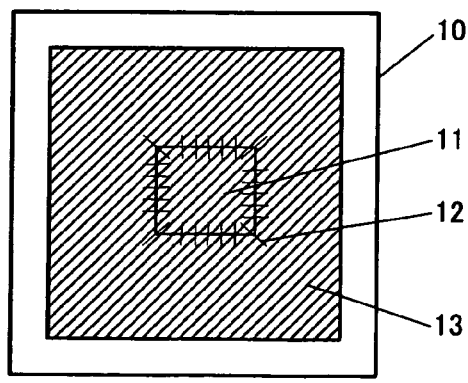
FIG. 10B is a diagram showing the BGA package after dividing into an individual piece.
Figure 11:
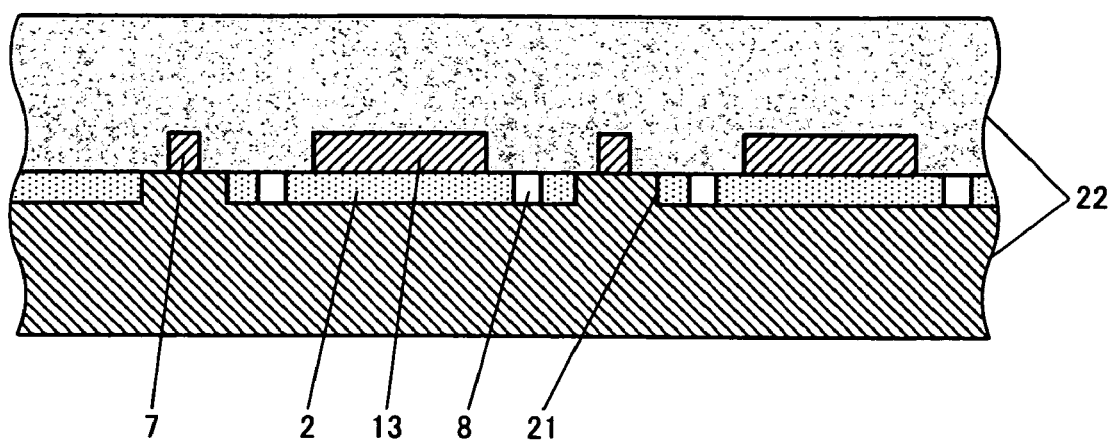
FIG. 11 is a sectional view taken along line A-A in FIG. 10A.

FIG. 10A shows an encapsulated state of a BGA package according to a ninth embodiment of the present invention. FIG. 10B shows a divided BGA package. FIG. 11 shows a resin encapsulation process. FIGS. 12A to 12C and FIGS. 13A and 13B show a process of manufacturing the BGA package using wiring substrate according to this embodiment.

As shown in FIGS. 10A and 10B, a semiconductor mount substrate S has a rectangular external shape and includes a group of segments 2 and a group of segments 5 each having areas in square form. The groups of segments 2 and 5 are respectively arranged at equal intervals in straight rows, i.e., the front row and the rear row. The groups of segments in the front and rear rows are formed parallel to each other. The segments 2 in the group of segments in the front row and the segments 5 in the group of segments in the rear row are arranged in a staggered array such that their arrangement intervals are half-pitch shifted from each other.

The peripheral sides of the segments 2 and 5 are parallel to the substrate peripheral edges of the frame 1 of the semiconductor mount substrate S. Each of the segments 2 and 5 has a semiconductor mount area, internal terminals and external terminals. The frame 1 of the semiconductor mount substrate S is formed of an outer connecting portion 1a and an intermediate connecting portion 1b. The outer connecting portion 1a is placed around the peripheries of the group of segments in the front row and the group of segments in the rear row to surround these groups of segments. The intermediate connecting portion 1b is placed between the group of segments in the front row and the group of segments in the rear row.

Openings 8 are formed around each of the segments 2 and 5. Each of the segments 2 and 5 is separated from the wiring substrate S by the openings 8. Front-row tie bars 3 and the rear-row tie bars 6 are formed between the outer connecting portion 1a and the segments 2 and 5 and between the intermediate connecting portion 1b and the segments 2 and 5. Plating areas (not shown in the figures) are provided on the front-row tie bars 3 and the rear-row tie bars 6.

The semiconductor mount substrate S has cuts 21 between the segments 5 in the group of segments in the front row. The cuts 21 extend from the substrate peripheral edge on one side to the intermediate connecting portion 1b. The rear-row tie bars 6 are positioned on the axes of the cuts 21.

Figure 12A:
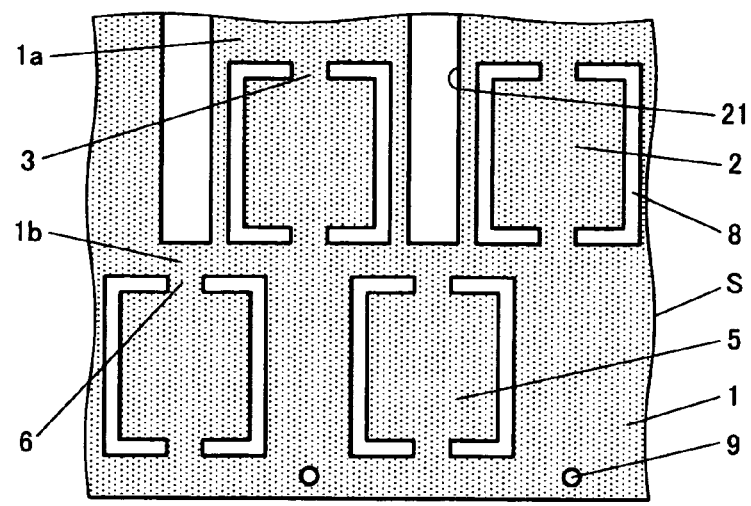
FIGS. 12A to 12C are diagrams showing a process of manufacturing the BGA package in the ninth embodiment.
Figure 12B:
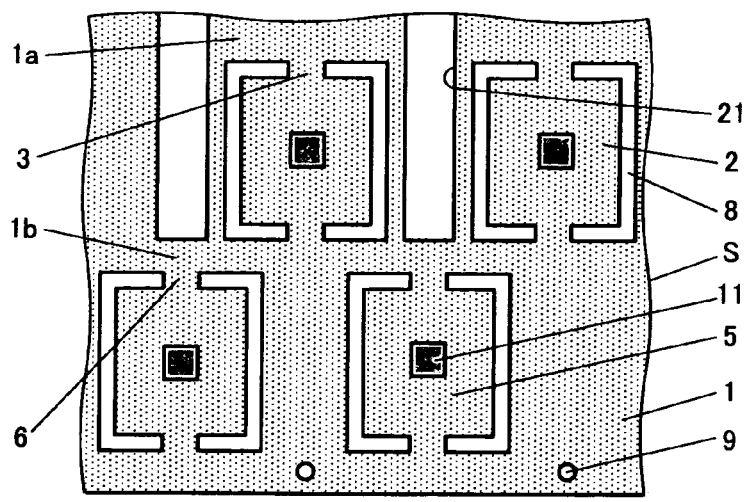

The BGA package using this semiconductor mount substrate S is manufactured by a process described below. As shown in FIG. 12B, chips 11 are die bonded to the segments 2 in the front row and to the segments 5 in the rear row on the wiring substrate S shown in FIG. 12A.

Figure 12C:
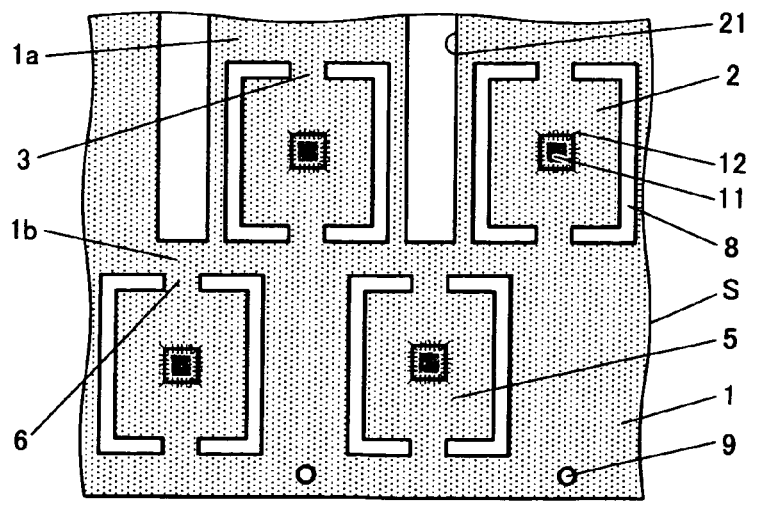

Subsequently, as shown in FIG. 12C, the chips 11 and electrodes of the segments 2 and 5 are connected to each other by wires 12.

Figure 13A:
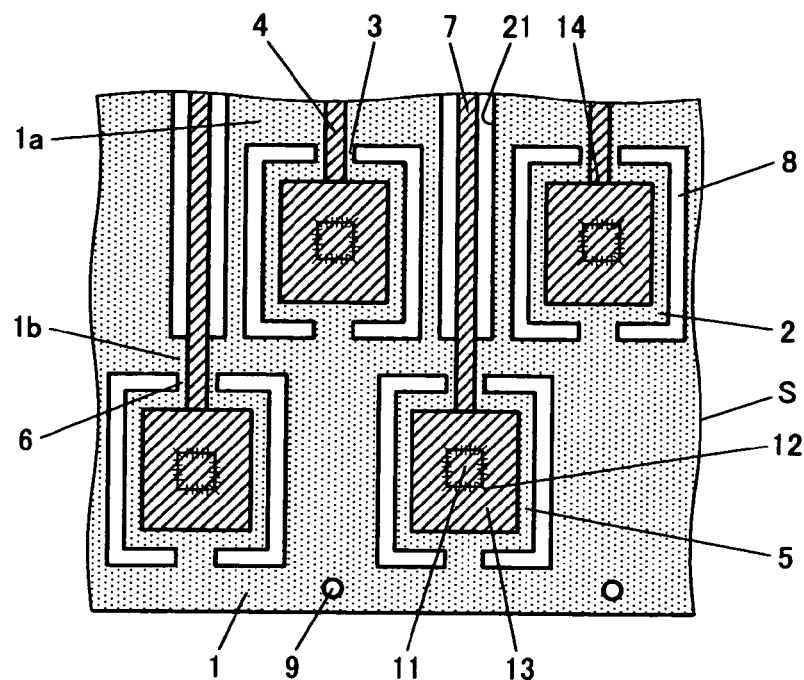
FIGS. 13A and 13B are diagrams showing the process of manufacturing the BGA package in the ninth embodiment.

Resin encapsulated portions 13 are then formed by an encapsulation resin, as shown in FIG. 13A. The resin encapsulated portions 13 are formed by using an encapsulation mold 22, as shown in FIG. 11. The encapsulation mold 22 has straight runner paths corresponding to the front-row tie bars 3 and the rear-row tie bars 6.

Figure 13B:
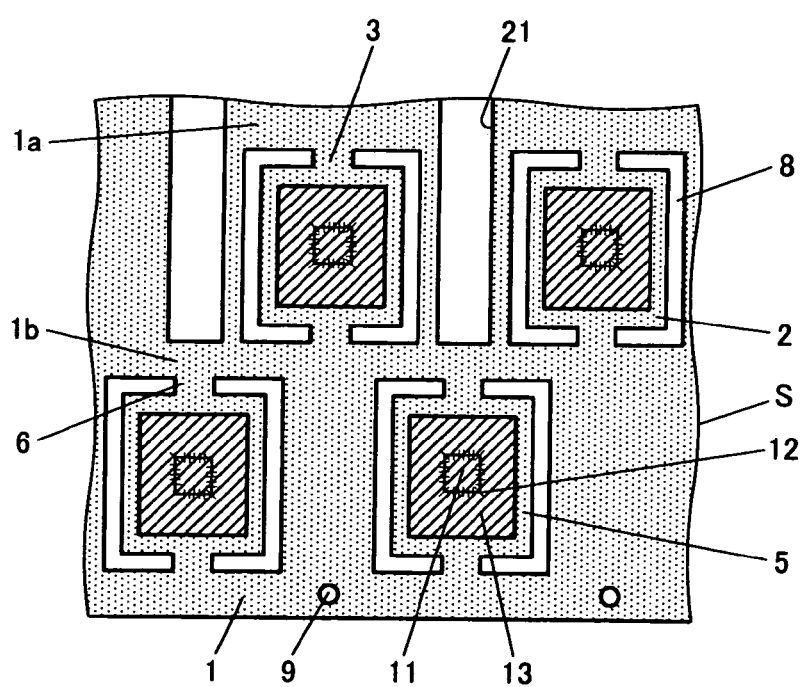

Subsequently, as shown in FIG. 13B, the runners 4 and 7 are removed from the frame 1 and the segments 2 and 5 by gate break.

In the wiring substrate S of this embodiment in the above-described process, the runners 4 to the front row and the runners 7 extend straight from the outer peripheral edge of the semiconductor mount substrate S on one side in a direction perpendicular to the edge to be joined to the centers of the portions 13 to be resin encapsulated on the segments 2 and 5 without bending at any halfway points.

This derives from the construction specific to the semiconductor mount substrate S. That is, the segments 2 in the front row and the segments 5 in the rear row are positioned in a staggered fashion such that the intervals at which the segments 2 in the front row are arranged and the intervals at which the segments 5 in the rear row are arranged are half-pitch shifted from each other; the rear-row tie bars 6 are placed between the segments 2 in the front row; and the gates 14 are placed at the centers of the outer peripheral sides of the portions 13 to be resin encapsulated.

Also, the boundary surfaces between the front-row and rear-row runners 4 and 7 and the portions 13 to be resin encapsulated extend in a direction perpendicular to the axes of the runners 4 and 7, i.e., a direction parallel to the substrate outer peripheral edges.

Therefore, at the time of gate break, i.e., when the runners 4 and 7 are separated from the package formed of the segments 2 and 5 and the resin encapsulated portions 13, stress acts uniformly at the boundary surfaces between the runners 4 and 7 and the resin encapsulated portions 13 in the direction perpendicular to the runners 4 and 7.

As a result, the occurrence of portions of the runners 4 and 7 remaining at the gates 14, the occurrence of chipping of the resin encapsulated portions 13 and the occurrence of separation of the resin encapsulated portions 13 can be reduced and improved gate breakability can be ensured.

The rear-row runners 7 are formed at the positions on the cuts 21 of the semiconductor mount substrate S almost entirely through the long runner distance to the segments 5. The major portion of each rear-row runner 7 is not joined to the semiconductor mount substrate S and only the portion in the vicinity of the gate is joined to the rear-row tie bar 6 and to the intermediate connecting portion 1b.

On the other hand, the front-row runners 4 are joined to the tie bars 3 by extending straight through a short runner distance from the substrate peripheral edge of the semiconductor mount substrate S to the segments 2 in the front row. Therefore, the short front-row runners 4 and the long rear-row runners 7 can be easily separated respectively from the semiconductor mount substrate S by forces substantially equal to each other.

Since the portions of the long rear-row runners 7 in the vicinity of the gates are joined to the tie bars 6 and to the intermediate connecting portion 1a, a load on each long rear-row runner 7 is not directly applied to the restricted cross section of the gate 14. Therefore, a cantilever supporting structure having suitable strength with reliability can be realized and it is possible to prevent the runner 7 from being inadvertently broken even when an unexpected force is applied to the runner 7 during conveyance for example. Handling of the substrate is thus made easier. After gate break, each package formed of the segment portion 2 or 5 and the resin encapsulated portion 13 is cut off from the frame 1, thus forming the BGA package 10.

Tenth Embodiment

Figure 14:
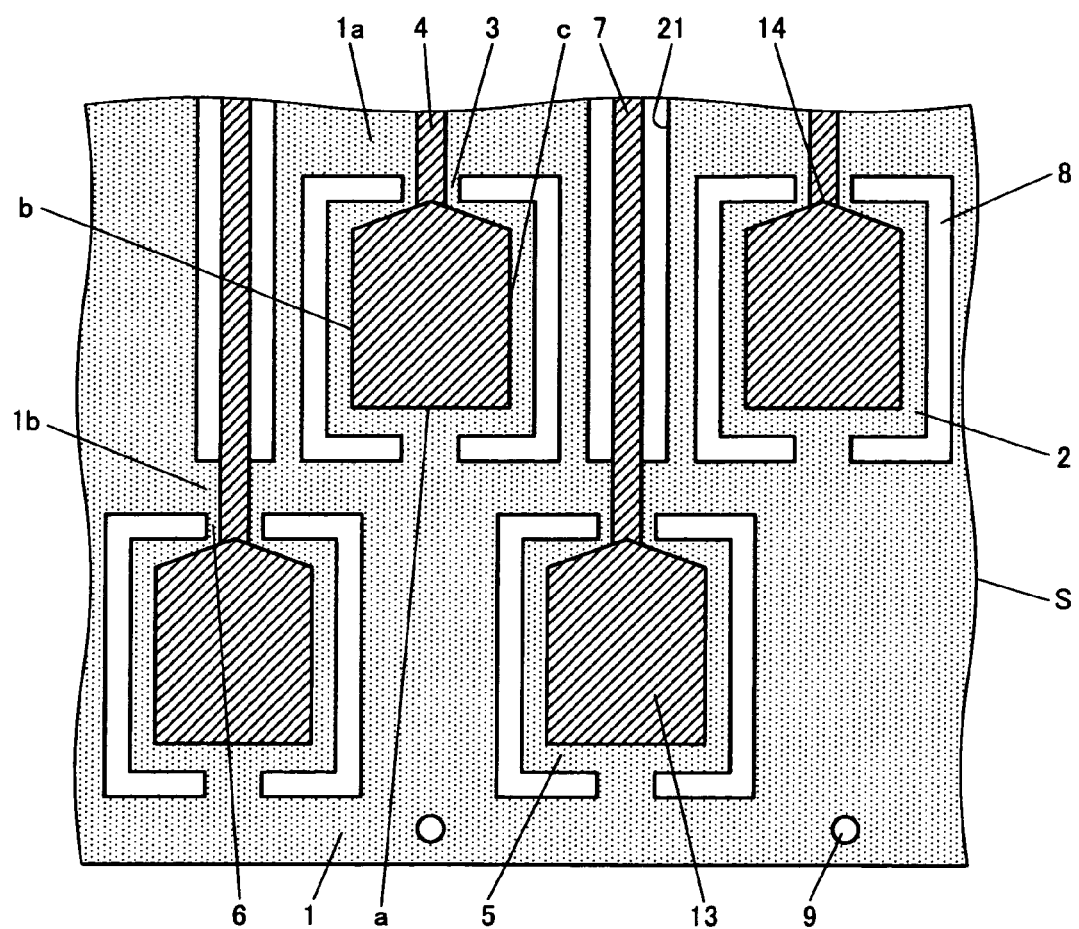
FIG. 14 is a diagram showing an encapsulated state of a BGA package according to a tenth embodiment of the present invention.

FIG. 14 shows an encapsulated state of a BGA package on a semiconductor mount substrate S in a tenth embodiment of the present invention. Referring to FIG. 14, the semiconductor mount substrate S is the same as that shown in FIG. 12A. The peripheral sides of segments 2 and 5 are formed parallel to the substrate peripheral edges of the frame 1. Chips 11 are mounted on the semiconductor mount areas, and resin encapsulated portions 13 in which the chips 11 are encapsulated are formed on the segments 2 and 5.

Each resin encapsulated portion 13 has a pentagonal external shape, and the gate 14 is placed at a first apex of the resin encapsulated portion 13. An air vent (not shown) is formed in a first side a of the resin encapsulated portion 13 opposite from the first apex and parallel to substrate peripheral edges of the frame 1. The first side a is perpendicular to a second side b and to a third side c. The second side b and the third side c are parallel to each other.

The above-described construction ensures improved gate breakability, as in the ninth embodiment. The encapsulation resin can be smoothly injected from the gate 14 through a path in the portion 13 to be resin encapsulated, which is not constricted, and two sides of the portion 13 to be resin encapsulated guide the encapsulation resin in the vicinity of the gate 14 to reduce the possibility of occurrence of voids at the corners. In the portion 13 to be resin encapsulated, the encapsulation resin moves straight to the air vent (not shown), so that the resin flow velocity is stabilized and easily controllable and the occurrence of voids and the occurrence of removal of the wires by the resin flow can be minimized.

Also, the runners 4 and 7 can be formed in a straight shape to the gates 14. Therefore, there is no need to widen the plating areas corresponding to the runners 4 and 7, and the wiring areas on the segments 2 and 5 can be effectively utilized in comparison with the method of widening the runners 4 and 7 immediately before the gates.

Eleventh Embodiment

Figure 15:
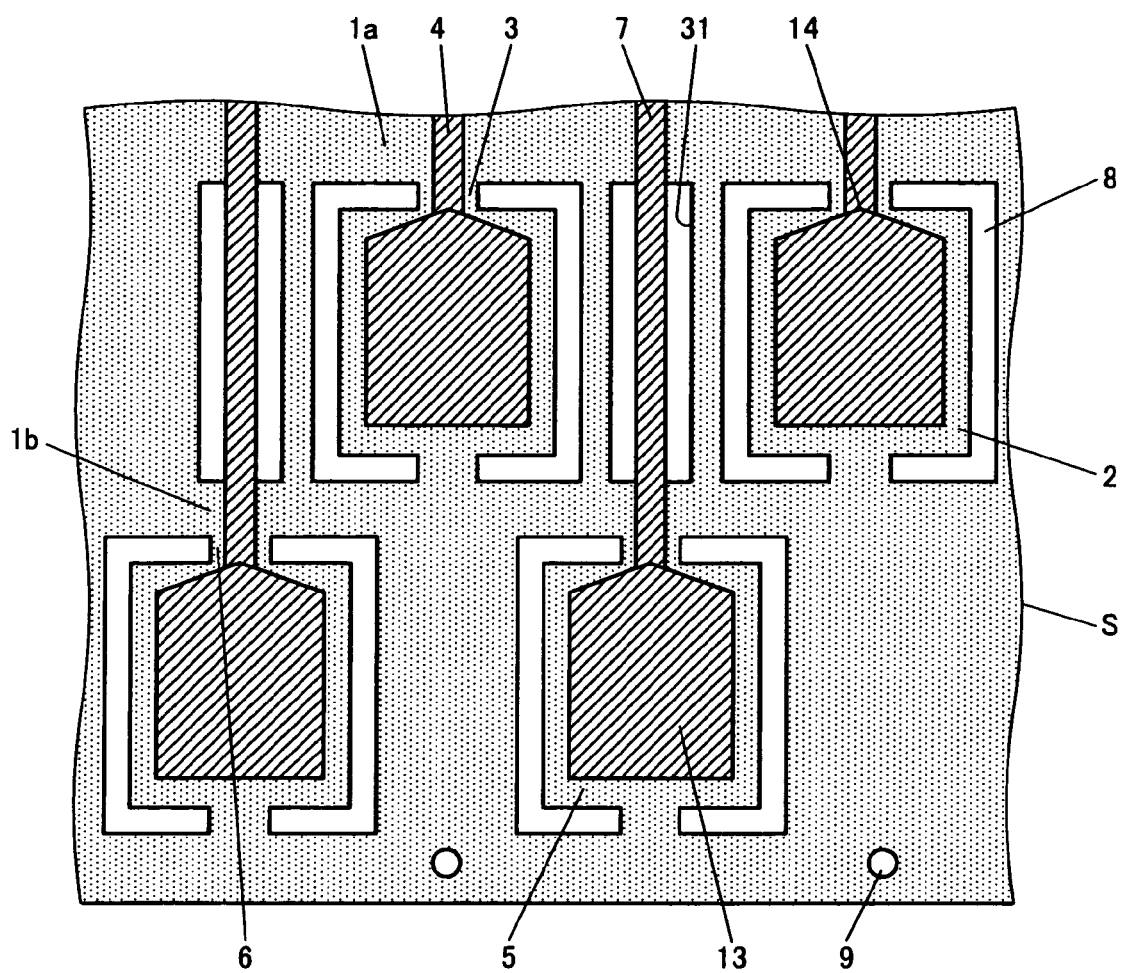
FIG. 15 is a diagram showing an encapsulated state of a BGA package according to an eleventh embodiment of the present invention.

FIG. 15 shows an encapsulated state of a BGA package on a semiconductor mount substrate S in an eleventh embodiment of the present invention. Referring to FIG. 15, the semiconductor mount substrate S is basically the same as that shown in FIG. 12A except for a portion. The peripheral sides of segments 2 and 5 are parallel to the substrate peripheral edges of the frame 1. Chips 11 are mounted on the semiconductor mount areas, and resin encapsulated portions 13 in which the chips 11 are encapsulated are formed on the segments 2 and 5. The resin encapsulated portions 13 are the same as those shown in FIG. 15. The description for the portions 13 will not be repeated.

A constructional feature in the eleventh embodiment resides in that cuts 31 are formed between an outer connecting portion 1a and an intermediate connecting portion 1b while portions of the outer connecting portion 1a outside the outer ends of the cuts 31 are left.

In the above-described construction, the long rear-row runners 7 has their base ends joined to the outer connecting portion 1a and has their end portions closer to the gates joined to the tie bars 6 and to the intermediate connecting portion 1b. Thus, a structure for supporting the runners 7 is formed in which a load on each long rear-row runner 7 is not directly applied to the restricted cross section of the gate 14, which supports opposite ends of the long runners 7 without supporting the portions corresponding to the cuts 31, and which has a suitable strength. It is, therefore, possible to prevent each runner 7 from being inadvertently broken even when an unexpected force is applied to the runner 7 during conveyance for example. Handling of the substrate is thus made easier. Other effects and advantages are the same as those in the tenth embodiment.

Twelfth Embodiment

Figure 16:
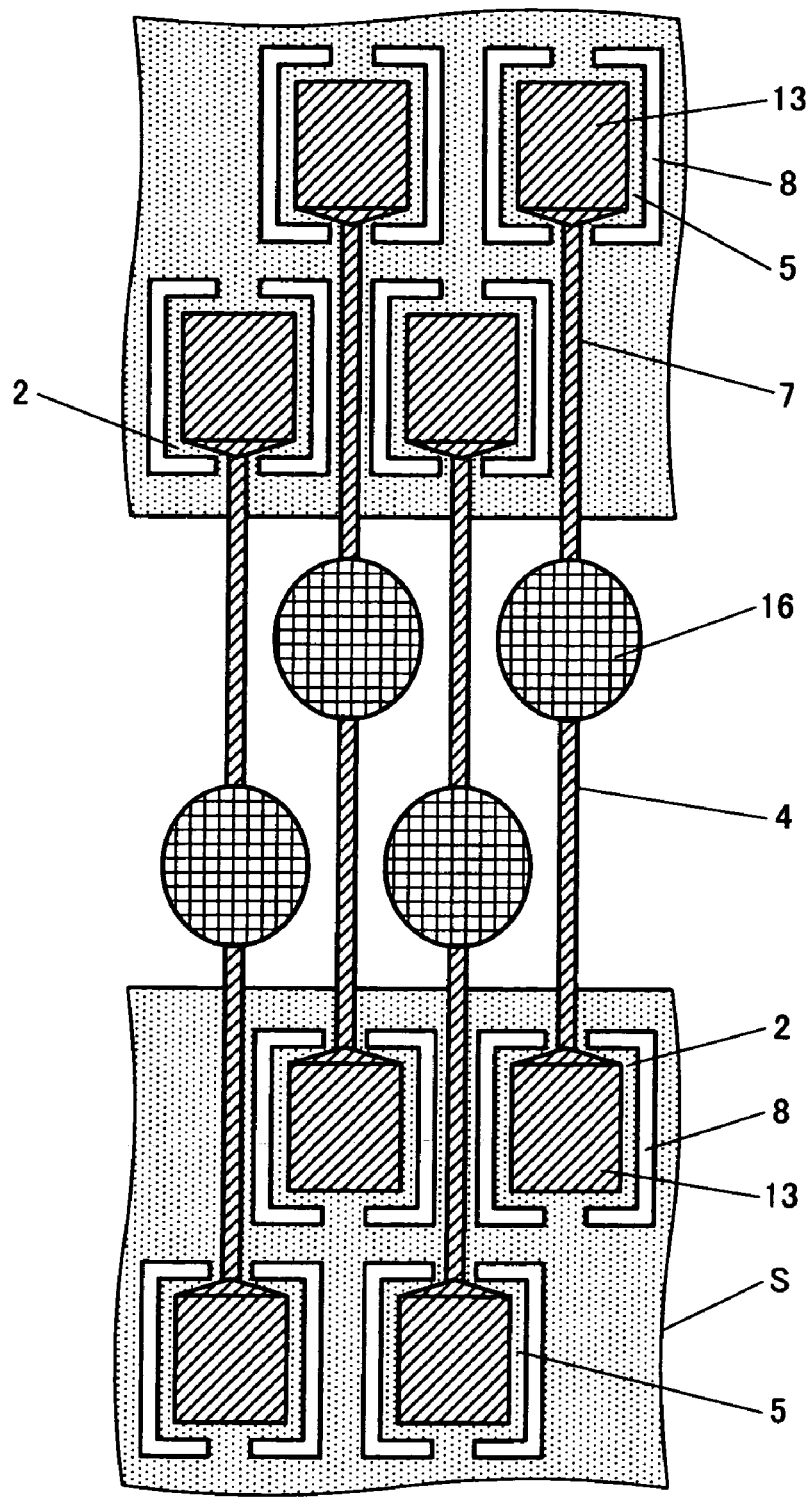
FIG. 16 is a diagram showing an encapsulated state of a BGA package according to a twelfth embodiment of the present invention.

FIG. 16 shows an encapsulated state of a BGA package on semiconductor mount substrate S in a twelfth embodiment of the present invention. Referring to FIG. 16, each semiconductor mount substrate S is the same as that shown in FIG. 8A. The peripheral sides of segments 2 and 5 are parallel to the substrate peripheral edges of the frame 1. Chips 11 are mounted on the semiconductor mount areas, and resin encapsulated portions 13 in which the chips 11 are encapsulated are formed on the segments 2 and 5. The resin encapsulated portions 13 are the same as those described above with reference to FIG. 8A, and are indicated by the same reference numeral. The description for the portions 13 will not be repeated.

A plurality of CALS 16 are linearly arranged between a pair of semiconductor mount substrates S at equal intervals along the outer peripheral edges of the semiconductor mount substrates S. From the CALS 16, runners 4 and 7 extend straight through equal runner distances to the pair of semiconductor mount substrates S. The CALS 16 are arranged in two rows, and the arrangement intervals of the CALS 16 in the two rows are half-pitch shifted from each other.

A method of manufacturing this BGA package will be described. A pair of semiconductor mount substrates S are placed in parallel with each other in an encapsulation mold (not shown), with the segments 2 in the front rows set inside. In the encapsulation mold, a plurality of pod plungers (shown as CALS 16 in FIG. 16) provided between the two semiconductor mount substrates S are linearly arranged at equal intervals to form pod plunger groups. The pod plungers in the two groups are arranged in parallel with each other in a staggered array such that the arrangement intervals of the pot plungers are half-pitch shifted from each other.

At this time, the pod plungers in the first pod plunger group, the segments 5 in the rear row on the first semiconductor mount substrate S and the segments 2 in the front row on the second semiconductor mount substrate S are positioned on straight lines.

In this state, runners 4 and 7 of equal runner distance are formed from the pod plungers to portions 13 to be resin encapsulated formed on the segments 2 and 5 of the two semiconductor mount substrates S.

Also, the pod plungers in the second pod plunger group, the segments 5 in the rear row on the second semiconductor mount substrate S and the segments 2 in the front row on the first semiconductor mount substrate S are positioned on straight lines. In this state, runners 4 and 7 of equal runner distance are formed from the pod plungers to portions 13 to be resin encapsulated formed on the segments 2 and 5 of the two semiconductor mount substrates S.

Thus, even in the case where segment groups are formed in two rows on each semiconductor mount substrate S, the time periods required for the resin from each pot plunger to reach the portions 13 to be resin encapsulated in the different rows in resin encapsulation are equalized. Moreover, the resin can be simultaneously supplied from one plunger to the portions 13 to be resin encapsulated on the pair of semiconductor mount substrates S.

Thirteenth Embodiment

Figure 17:
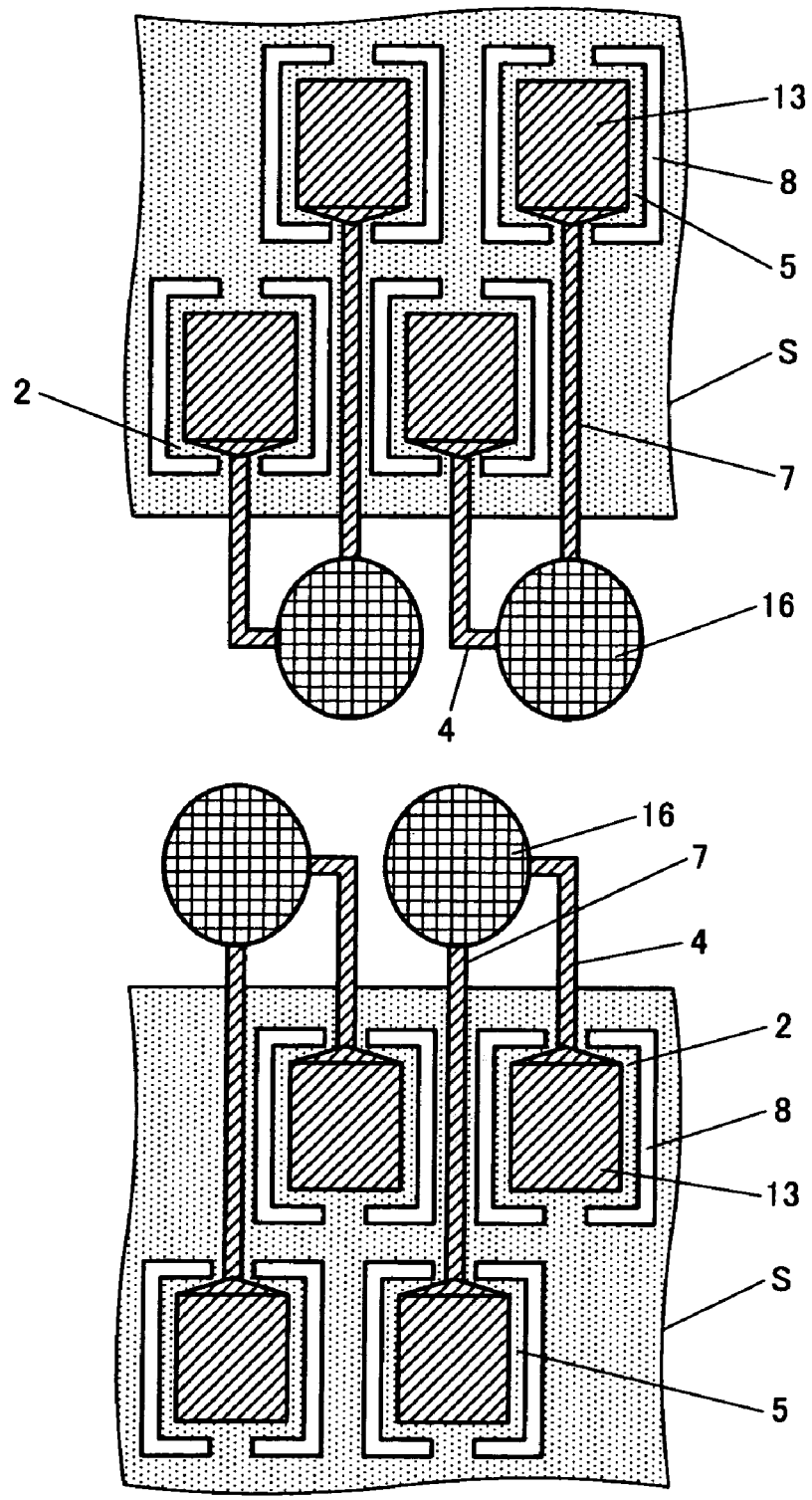
FIG. 17 is a diagram showing an encapsulated state of a BGA package according to a thirteenth embodiment of the present invention.

FIG. 17 shows an encapsulated state of a BGA package on semiconductor mount substrates S in a thirteenth embodiment of the present invention. Referring to FIG. 17, each semiconductor mount substrate S is the same as that shown in FIG. 12A. The peripheral sides of segments 2 and 5 are parallel to the substrate peripheral edges of the frame 1. Chips 11 are mounted on the semiconductor mount areas, and resin encapsulated portions 13 in which the chips 11 are encapsulated are formed on the segments 2 and 5. The resin encapsulated portions 13 are the same as those described above with reference to FIG. 8A, and are indicated by the same reference numeral. The description for the same portions 13 will not be repeated.

A plurality of CALS 16 are linearly arranged between a pair of semiconductor mount substrates S at equal intervals along the outer peripheral edges of the semiconductor mount substrates S. From the CALS 16, runners 4 and 7 extend to the semiconductor mount substrates S. The CALS 16 are arranged in two rows, and the arrangement intervals of the CALS 16 in the two rows are half-pitch shifted from each other.

A method of manufacturing this BGA package will be described. A pair of semiconductor mount substrates S are placed in parallel with each other in an encapsulation mold (not shown), with the segments 2 in the front rows set inside. In the encapsulation mold, a plurality of pod plungers (shown as CALS 16 in FIG. 17) provided between the two semiconductor mount substrates S are linearly arranged at equal intervals to form pod plunger groups. The pod plungers in the two groups are arranged in parallel with each other in a staggered array such that the arrangement intervals of the pot plungers are half-pitch shifted from each other.

At this time, the pod plungers in the first pod plunger group, the segments 5 in the rear row on the first semiconductor mount substrate S and the segments 2 in the front row on the second semiconductor mount substrate S are positioned on straight lines. Also, the pod plungers in the second pod plunger group, the segments 5 in the rear row on the second semiconductor mount substrate S and the segments 2 in the front row on the first semiconductor mount substrate S are positioned on straight lines.

In this state, runners 7 are formed straight from the pod plungers in the first pod plunger group to portions 13 to be resin encapsulated on the rear-row segments 5 of the first semiconductor mount substrate S, and runners 4 are formed in bent form from the pod plungers to portions 13 to be resin encapsulated on the front-row segments 2 of the first semiconductor mount substrate S.

Also, runners 7 are formed straight from the pod plungers in the second pod plunger group to portions 13 to be resin encapsulated on the rear-row segments 5 of the second semiconductor mount substrate S, and runners 4 are formed in bent form from the pod plungers to portions 13 to be resin encapsulated on the front-row segments 2 of the second semiconductor mount substrate S.

Even in the case where segment groups are formed in two rows on each semiconductor mount substrate S, the time periods required for the resin from each pod plunger to reach the portions 13 to be resin encapsulated in the different rows in resin encapsulation can be equalized. This effect is realized by using a combination of the difference between the resin flow velocity in the straight runner 7 and the resin flow velocity in the bent runner 4 and the difference between the runner distances. Moreover, the resin can be simultaneously supplied from one plunger to the portions 13 to be resin encapsulated in the different rows on each semiconductor mount substrate S.

Fourteenth Embodiment

Figure 18:
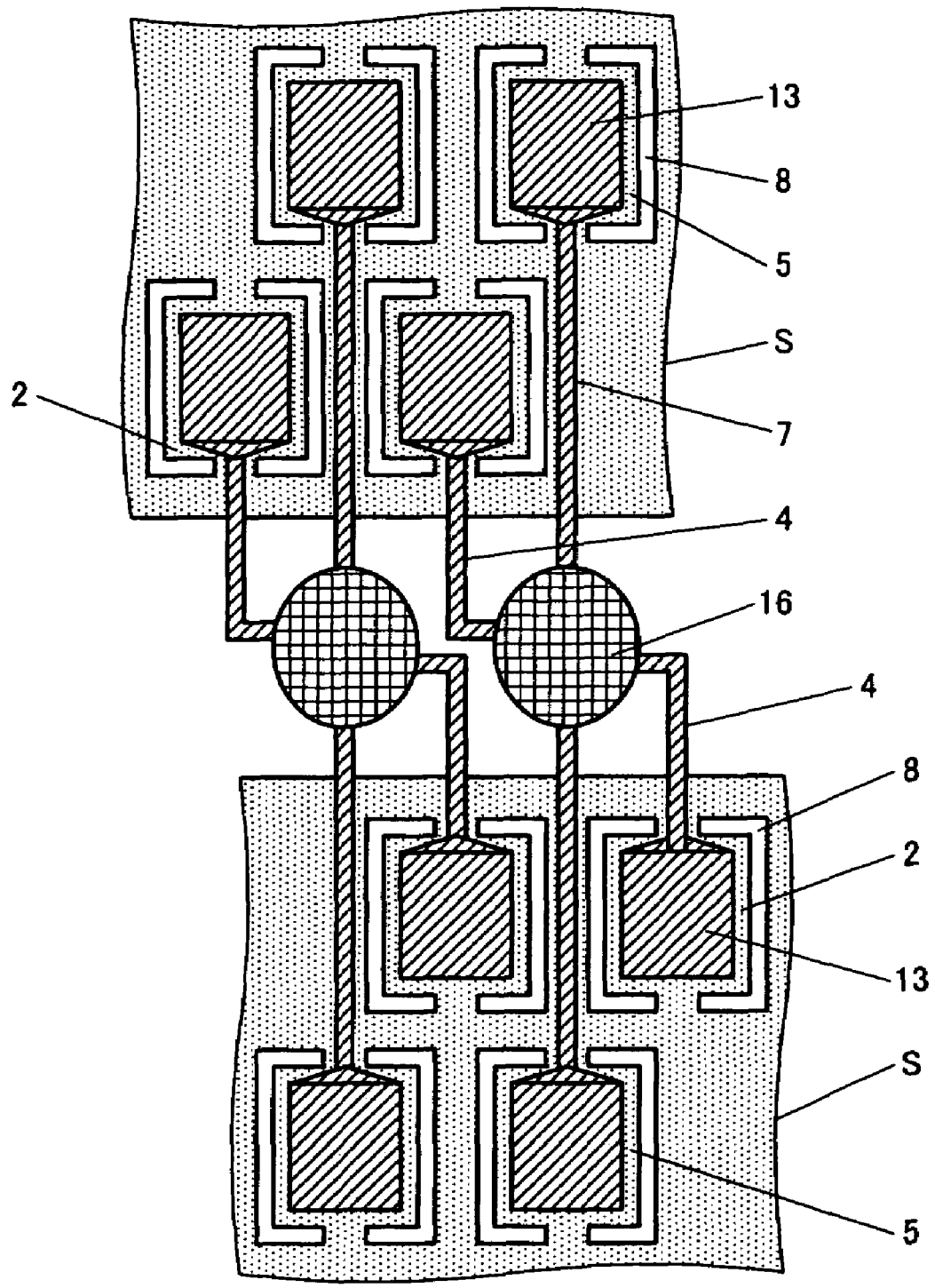
FIG. 18 is a diagram showing an encapsulated state of a BGA package according to a fourteenth embodiment of the present invention.

FIG. 18 shows an encapsulated state of a BGA package on semiconductor mount substrates S in a fourteenth embodiment of the present invention. Referring to FIG. 18, each semiconductor mount substrate S is the same as that shown in FIG. 12A. The peripheral sides of segments 2 and 5 are parallel to the substrate peripheral edges of the frame 1. Chips 11 are mounted on the semiconductor mount areas, and resin encapsulated portions 13 in which the chips 11 are encapsulated are formed on the segments 2 and 5. The resin encapsulated portions 13 are the same as those described above with reference to FIG. 8A, and are indicated by the same reference numeral. The description for the same portions 13 will not be repeated.

A plurality of CALS 16 are linearly arranged between a pair of semiconductor mount substrates S at equal intervals along the outer peripheral edges of the semiconductor mount substrates S. From the CALS 16, runners 4 and 7 extend to the semiconductor mount substrates S.

A method of manufacturing this BGA package will be described. A pair of semiconductor mount substrates S are placed in parallel with each other in an encapsulation mold (not shown), with the segments 2 in the front rows set inside. In the encapsulation mold, a plurality of pod plungers (shown as CALS 16 in FIG. 18) provided between the two semiconductor mount substrates S are linearly arranged at equal intervals to form a pod plunger group.

At this time, the pod plungers in the pod plunger group, the segments 5 in the rear row on the first semiconductor mount substrate S and the segments 5 in the rear row on the second semiconductor mount substrate S are positioned on straight lines. Also, each pod plunger of the pod plunger group, each segment 2 in the front row on the first semiconductor mount substrate S, and each segment 2 in the front row on the second semiconductor mount substrate S are positioned on straight lines.

In this state, runners 7 of equal runner distance are formed straight from the pod plungers to portions 13 to be resin encapsulated formed on the rear-row segments 5 of the two semiconductor mount substrates S. Also, runners 4 are formed in bent form from the pod plungers to portions 13 to be resin encapsulated on the front-row segments 2 of the two semiconductor mount substrate S, the runners 4 from each pod plunger being in point symmetry about the pod plunger.

Even in the case where segment groups are formed in two rows on each semiconductor mount substrate S, the time periods required for the resin from each pod plunger to reach the portions 13 to be resin encapsulated in the different rows in resin encapsulation can be equalized. This effect is realized by using a combination of the difference between the resin flow velocity in the straight runner 7 and the resin flow velocity in the bent runner 4 and the difference between the runner distances. Moreover, the resin can be simultaneously supplied from one plunger to the portions 13 to be resin encapsulated in the different rows on the pair of semiconductor mount substrates S, i.e., the portions 13 to be resin encapsulated in four places in this embodiment, thus reducing the number of pod plungers.

Fifteenth Embodiment

Figure 19:
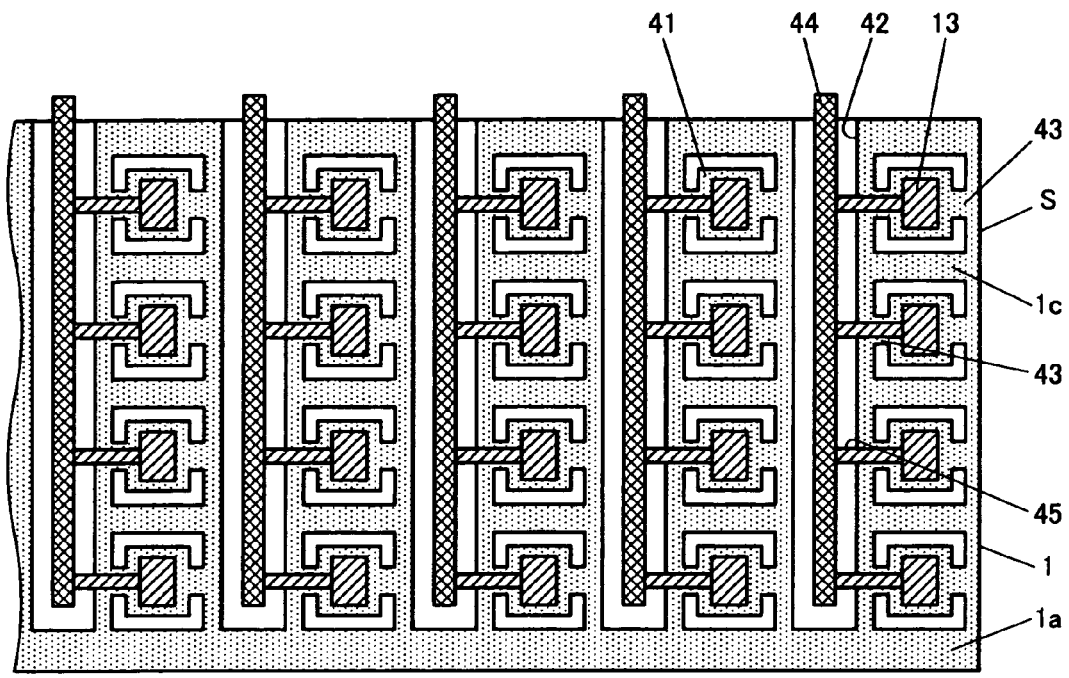
FIG. 19 is a diagram showing an encapsulated state of a BGA package according to a fifteenth embodiment of the present invention.

FIG. 19 shows an encapsulated state of a BGA package on a semiconductor mount substrate S in a fifteenth embodiment of the present invention. Referring to FIG. 19, each of segments 41 of the semiconductor mount substrate S has a semiconductor mount area and internal and external terminals; a chip (not shown) is mounted on each semiconductor mount area; and a resin encapsulated portion 13 in which the chip (not shown) is encapsulated is formed on each segment 41.

The semiconductor mount substrate S has the plurality of segments 41 arranged at equal intervals in straight rows to form a plurality of segment groups arranged in parallel with each other. A frame 1 of the semiconductor mount substrate S is formed of an outer connecting portion 1a and segment connecting portions 1c. Each segment connecting portion 1c is placed around the periphery of the corresponding group of segments to surround the same. The outer connecting portion 1a is placed along the substrate peripheral edge on one side to connect the segment connecting portions 1c.

The semiconductor mount substrate S has cuts 42 formed between the segment groups. The cuts 42 are formed along the direction of arrangement of the segments 41. Each cut 42 extends from the substrate peripheral edge opposite from the outer connecting portion 1a to the outer connecting portion 1a, and the frame 1 is left uncut on the one side of the semiconductor mount substrate S.

Openings 8 are formed around each segment 41. Tie bars 43 connecting the segment connecting portion 1c and the segment 41 are formed in a direction perpendicular to the axis of the cut 42.

In the above-described construction, long main runners 44 are formed at positions corresponding to the cuts 42. Short sub runners 45 branching off from the long main runners 44 can reach centers of the portions 13 to be resin encapsulated of the segment 41 by extending straight. It is not necessarily required that the short sub runners 45 branch off from the long main runners 44 at right angles. A different construction in which the sub runners 45 are extended straight to be joined to the portions 13 to be resin encapsulated may suffice.

The boundary surfaces between the short sub runners 45 and the portions 13 to be resin encapsulated extend in a direction perpendicular to the axes of the sub runners 45, i.e., a direction parallel to the substrate peripheral edges.

At the time of gate break, i.e., when the main runners 44 and the sub runners 45 are disconnected from the package formed of the segments 41 and the resin encapsulated portions 13, the long main runners 44 are lifted from the wiring substrate S. At this time, a moment about an axis perpendicular to the axes of the sub runner 45 acts on each sub runner 45, and stress works at the boundary surface between the runner 45 and the resin encapsulated portion 13 uniformly in a direction perpendicular to the axis of the sub runner 45.

Therefore, the occurrence of portions of the short sub runners 45 remaining at the gates 14, the occurrence of chipping of the resin encapsulated portions 13 and the occurrence of separation of the resin encapsulated portions 13 can be reduced.

The long main runners 44 are separated from the semiconductor mount substrate S by the cuts 42 through the entire runner distance, and the short sub runners 45 are only joined to the segment connecting portions 1c and the tie bars 43. Therefore, the short subrunners 45 can be easily separated by substantially equal forces from the semiconductor mount substrate S in all the segments 41 arranged-in grid form.

While the long main runners 44 are separated from the semiconductor mount substrate S by the cuts 42 through the entire runner distance, the short sub runners 45 are joined to the segment connecting portions 1c and to the tie bars 43 to ensure that a load on the long main runners 44 does not act directly on the narrow cross section of the gates 14, and that a suitable strength is realized.

It is, therefore, possible to prevent the runners 44 and 45 from being inadvertently broken even when an unexpected force is applied to the runners 44 and 45 during conveyance for example. Handling of the substrate is thus made easier.

Sixteenth Embodiment

Figure 20:
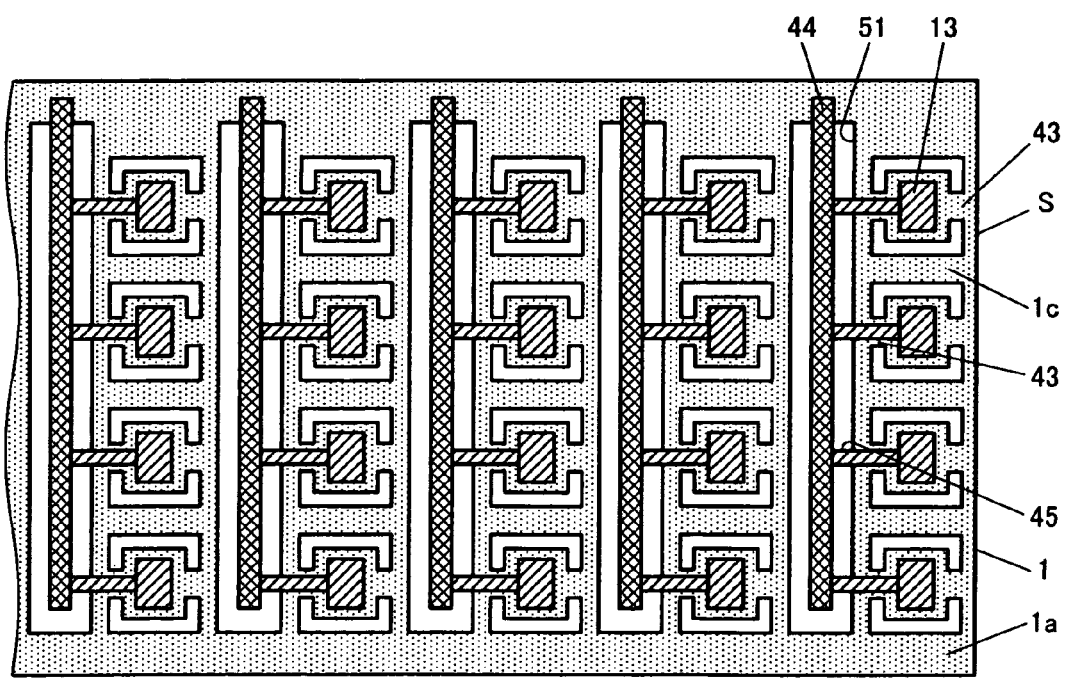
FIG. 20 is a diagram showing an encapsulated state of a BGA package according to a sixteenth embodiment of the present invention.
Figure 21A:
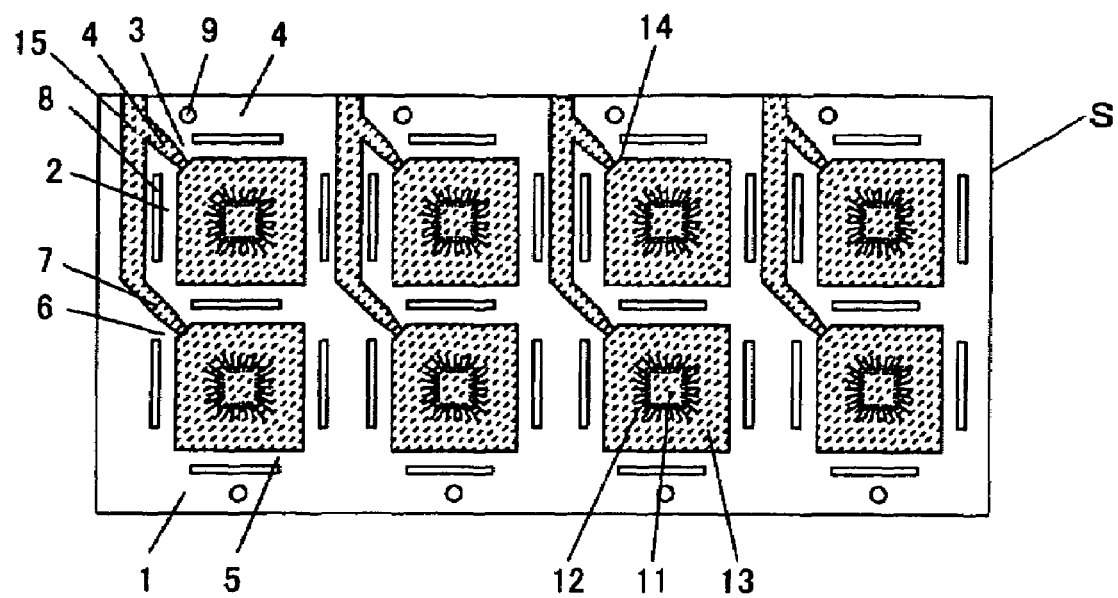
FIG. 21A is a diagram showing a conventional arrangement and an encapsulated state of a BGA package on a substrate.
Figure 21B:
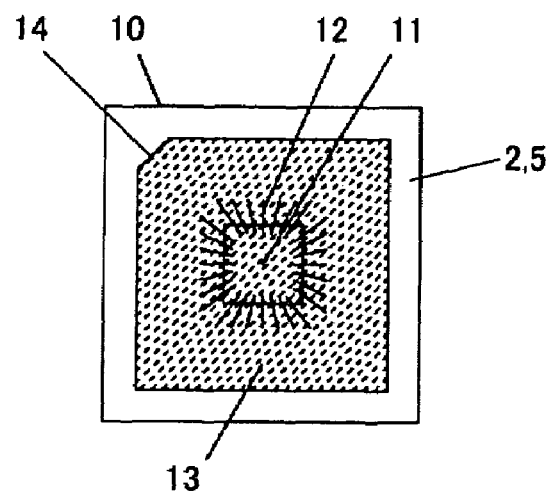
FIG. 21B is a diagram showing the BGA package after dividing into an individual piece.

FIG. 20 shows an encapsulated state of a BGA package on a semiconductor mount substrate S in a sixteenth embodiment of the present invention. Referring to FIG. 20, the semiconductor mount substrate S is basically the same as that shown in FIG. 19 except for a portion.

A constructional feature of this embodiment resides in that the semiconductor mount substrate S has two outer connecting portions 1a of the frame 1 placed along opposite substrate peripheral edges to connect opposite ends of segment connecting portions 1c.

The semiconductor mount substrate S has cuts 51 formed between the groups of segments. The cuts 51 are formed along the direction of arrangement of the segments 41. Each cut 51 extends between the two outer connecting portions 1c, and the frame 1 is left uncut on the two sides of the semiconductor mount substrate S.

In the above-described construction, the long main runners 44 has their base ends joined to the frame 1 except at the cuts 51 and are supported by the plurality of short sub runners 45. Therefore, a load on the long main runners 44 does not act directly on the narrow cross section of the gates 14, and a suitable strength can be realized.

It is, therefore, possible to prevent the runners 44 and 45 from being inadvertently broken even when an unexpected force is applied to the runners 44 and 45 during conveyance for example. Handling of the substrate is thus made easier.

The scope of use and the effective scope of the present invention are such that the present invention in each of the above-described embodiments is effective not only as the BGA package but also in various applications, for example, to a semiconductor package in which segments 2 and 5 are formed as lead frames, to any of various semiconductor packages other than those described above, and to various resin encapsulated elements.

What is claimed is:

1. A semiconductor mount substrate provided as a wiring substrate having a plurality of segments arranged at equal intervals in straight rows to form segment groups, a pair of the segment groups being arranged in parallel with each other, and an outer connecting portion placed along substrate peripheral edges to surround the segment group in the front row and the segment group in the rear row, a semiconductor mount area, internal terminals and external terminals being provided on each segment, the semiconductor mount substrate comprising:
    a staggered array of the segments formed by half-pitch shifting the arrangement intervals of the segment group in the front row and the arrangement intervals of the segment group in the rear row from each other;
    rear-row tie bars provided between the segments in the front row to connect the segments in the rear row and the outer connecting portion; and
    front-row tie bars provided between the segments in the rear row to connect the segments in the front row and the outer connecting portion.

2. The semiconductor mount substrate according to claim 1, wherein openings are provided to separate the segments in the front row and the rear-row tie bars from each other and to separate the segments in the rear row and the front-row tie bars from each other.

3. The semiconductor mount substrate according to claim 1, wherein the external shape of the wiring substrate is rectangular and the peripheral sides of the segments are parallel to the substrate peripheral edges.

4. A semiconductor device comprising a semiconductor element mounted on the semiconductor mount area of the segment of the semiconductor mount substrate according to claim 3, and a resin encapsulated portion in which the semiconductor element is encapsulated, and which is formed on the segment, wherein the sides of the external shape of the resin encapsulated portion are parallel to the peripheral sides of the segment.

5. A semiconductor device comprising a semiconductor element mounted on the semiconductor mount area of the segment of the semiconductor mount substrate according to claim 3, and a resin encapsulated portion in which the semiconductor element is encapsulated, and which is formed on the segment, wherein the sides of the external shape of the resin encapsulated portion are inclined through 45 degrees from the peripheral sides of the segment.

6. A semiconductor device comprising a semiconductor element mounted on the semiconductor mount area of the segment of the semiconductor mount substrate according to claim 3, and a resin encapsulated portion in which the semiconductor element is encapsulated, and which is formed on the segment, wherein the external shape of the resin encapsulated portion is a regular octagonal shape, and the sides of the external shape of the resin encapsulated portion are inclined through 45 degrees from the peripheral sides of the segment or parallel to the peripheral edges of the segment.

7. The semiconductor mount substrate according to claim 1, wherein the external shape of the wiring substrate is rectangular and the peripheral sides of the segments are inclined through 45 degrees from the substrate peripheral edges.

8. A semiconductor device comprising a semiconductor element mounted on the semiconductor mount area of the segment of the semiconductor mount substrate according to claim 7, and a resin encapsulated portion in which the semiconductor element is encapsulated, and which is formed on the segment, wherein the sides of the external shape of the resin encapsulated portion are parallel to the peripheral sides of the segment.

9. A semiconductor device comprising a semiconductor element mounted on the semiconductor mount area of the segment of the semiconductor mount substrate according to claim 7, and a resin encapsulated portion in which the semiconductor element is encapsulated, and which is formed on the segment, wherein the external shape of the resin encapsulated portion is a regular octagonal shape, and the sides of the external shape of the resin encapsulated portion are inclined through 45 degrees from the peripheral sides of the segment or parallel to the peripheral edges of the segment.

10. The semiconductor mount substrate according to claim 1, wherein the segments in the front and rear rows are formed as lead frames.

11. The semiconductor mount substrate according to claim 1, wherein an intermediate connecting portion is provided between the segment group in the front row and the segments in the rear row; openings are formed around each of the segments; the front-row tie bars and the rear-row tie bars are formed between the outer connecting portion and the segments and between the intermediate connecting portion and the segments; cuts are formed between the segments in the front row so as to extend from the substrate peripheral edge on one side to the intermediate connecting portion; and the rear-row tie bars connecting the segments in the rear row and the intermediate connecting portion are positioned on the axes of the cuts.

12. A semiconductor device comprising a semiconductor element mounted on the semiconductor mount area of the segment of the semiconductor mount substrate according to claim 11, a resin encapsulated portion in which the semiconductor element is encapsulated, and which is formed on the segment, and straight runners extending from the substrate peripheral edge to the resin encapsulated portions on the segments in the front and rear rows, wherein a short front-row runner is joined to the outer connecting portion and to the front-row tie bar, and a long rear-row runner corresponding to the cut is joined to the semiconductor mount substrate only at the intermediate connecting portion and the rear-row tie bar.

13. The semiconductor mount substrate according to claim 1, wherein an intermediate connecting portion is provided between the segment group in the front row and the segments in the rear row; openings are formed around each of the segments; the front-row tie bars and the rear-row tie bars are formed between the outer connecting portion and the segments and between the intermediate connecting portion and the segments; cuts are formed between the segments in the front row so as to extend from the outer connecting portion to the intermediate connecting portion; and the rear-row tie bars connecting the segments in the rear row and the intermediate connecting portion are positioned on the axes of the cuts.

14. A semiconductor device comprising a semiconductor element mounted on the semiconductor mount area of the segment of the semiconductor mount substrate according to claim 13, a resin encapsulated portion in which the semiconductor element is encapsulated, and which is formed on the segment, and straight runners extending from the substrate peripheral edge to the resin encapsulated portions on the segments in the front and rear rows, wherein a short front-row runner is joined to the outer connecting portion and to the front-row tie bar, and a long rear-row tie bar corresponding to the cuts is joined to the semiconductor mount substrate only at the outer connecting portion, the intermediate connecting portion and the rear-row tie bar.

15. A semiconductor device comprising a semiconductor element mounted on the semiconductor mount area of the segment of the semiconductor mount substrate according to claim 1, and a resin encapsulated portion in which the semiconductor element is encapsulated, and which is formed on the segment, wherein the external shape of the resin encapsulated portion is a pentagonal shape, and a first apex of the resin encapsulated portion is positioned on the front-row tie bar and the axis of the rear-row tie bar.

16. The semiconductor device according to claim 15, wherein the resin encapsulated portion has a resin injection port at the first apex and an air vent in a first side facing the first apex and parallel to the substrate peripheral edge.

17. The semiconductor device according to claim 16, wherein second and first sides of the resin encapsulated portion perpendicular to the first side are parallel to each other.

18. The semiconductor device according to claim 15, wherein the resin encapsulated portion has a resin injection port at the first apex, includes an inflow regulation region having the resin injection portion and a filling region including the semiconductor element, and has a groove for sectioning between the inflow regulation region and the filling region, the groove extending through the entire width of the filling region in parallel with the substrate peripheral edge.

19. A semiconductor device comprising a semiconductor element mounted on the semiconductor mount area of the segment of the semiconductor mount substrate according to claim 1, and a resin encapsulated portion in which the semiconductor element is encapsulated, and which is formed on the segment, wherein the external shape of the resin encapsulated portion is a hexagonal shape; a first apex of the resin encapsulated portion and a second apex opposite from the first apex are positioned on the front-row tie bar and the axis of the rear-row tie bar; and the resin encapsulated portion has a resin injection port at the first apex and an air vent at the second apex, includes an inflow regulation region having the resin injection portion, a filling region including the semiconductor element and a vent region having the air vent, has a groove for sectioning between the inflow regulation region and the filling region, the groove extending through the entire width of the filling region in parallel with the substrate peripheral edge, and has a second groove for sectioning between the filling region and the vent region, the second groove extending through the entire width of the filling region in parallel with the substrate peripheral edge.

20. A method of manufacturing a semiconductor package comprising:
- using the semiconductor mount substrate according to claim 1;
- arranging plating areas on the front-row tie bars and the rear-row tie bars, the plating areas extending from the outer connecting portion to the segments;
- mounting semiconductor elements on the semiconductor mount areas on the segments;
- forming, on the plating areas, resin encapsulated portions in which the semiconductor elements are encapsulated, by using an encapsulation mold for forming straight runners on the plating areas;
- separating the runners from the segments and the encapsulated portions; and
- separating the segments from the semiconductor mount substrate.

21. The method according to claim 20, wherein a pair of the semiconductor mount substrates are placed in parallel with each other on the encapsulation mold, with the segment groups in the front rows on the two semiconductor mount substrates set inside; a plurality of pod plungers provided between the two semiconductor mount substrates are linearly arranged at equal intervals to form a pod plunger group; and a pair of the pod plunger groups are placed in parallel with each other in a staggered array while half-pitch shifting the arrangement intervals of the pod plungers in the two pod plunger groups from each other, wherein the pod plungers in the first pod plunger group, the segments in the rear row on the first semiconductor mount substrate and the segments in the front row on the second semiconductor mount substrate are placed on a straight line; and runners of equal runner distance are formed from the pod plungers to the portions to be resin encapsulated formed on the segments in the two rows, and wherein the pod plungers in the second pod plunger group, the segments in the rear row on the second semiconductor mount substrate and the segments in the front row on the first semiconductor mount substrate are placed on a straight line; and runners of equal runner distance are formed from the pod plungers to the portions to be resin encapsulated formed on the segments in the two rows.

22. The method according to claim 20, wherein a pair of the semiconductor mount substrates are placed in parallel with each other on the encapsulation mold, with the segment groups in the front rows on the two semiconductor mount substrates set inside; a plurality of pod plungers provided between the two semiconductor mount substrates are linearly arranged at equal intervals to form a pod plunger group; and a pair of the pod plunger groups are placed in parallel with each other in a staggered array while half-pitch shifting the arrangement intervals of the pod plungers in the two pod plunger groups from each other, wherein the pod plungers in the first pod plunger group, the segments in the rear row on the first semiconductor mount substrate and the segments in the front row on the second semiconductor mount substrate are placed on a straight line; and the pod plungers in the second pod plunger group, the segments in the front row on the first semiconductor mount substrate and the segments in the rear row on the second semiconductor mount substrate are placed on a straight line, wherein runners are formed straight from the pod plungers in the first pod plunger group to the portions to be resin encapsulated on the segments in the rear row of the first semiconductor mount substrate; and runners in bent form are formed from the pot plungers to the portions to be resin encapsulated on the segments in the front row of the first semiconductor mount substrate, and wherein runners are formed straight from the pod plungers in the second pod plunger group to the portions to be resin encapsulated on the segments in the rear row of the second semiconductor mount substrate; and runners in bent form are formed from the pot plungers to the portions to be resin encapsulated on the segments in the front row of the second semiconductor mount substrate.

23. The method according to claim 20, wherein a pair of the semiconductor mount substrates are placed in parallel with each other on the encapsulation mold, with the segment groups in the front rows on the two semiconductor mount substrates set inside; and a plurality of pod plungers provided between the two semiconductor mount substrates are linearly arranged at equal intervals to form a pod plunger group, wherein the pod plungers and the segments in the rear rows on the two semiconductor mount substrate are placed on a straight line; runners of equal runner distance are formed straight from the pod plungers to the portions to be resin encapsulated formed on the segments in the rear rows of the two semiconductor mount substrates; and runners are formed in bent form from the pod plungers to portions to be resin encapsulated on the segments in the front rows of the two semiconductor mount substrates, the runners from each pod plunger being in point symmetry about the pod plunger.

24. A semiconductor mount substrate provided as a wiring substrate having a plurality of segments arranged at equal intervals in straight rows to form segment groups, a plurality of the segment groups being arranged in parallel with each other, and a segment connecting portion placed around the periphery of each segment group to surround the same, a semiconductor mount area, internal terminals and external terminals being provided on each segment, the semiconductor mount substrate comprising:
- an outer connecting portion connecting the segment groups, the outer connecting portion being placed along a substrate peripheral edge on one side;
- cuts formed between the segment groups so as to extend from another substrate peripheral edge on the other side opposite from the outer connecting portion to the outer connecting portion, the cuts being formed along a direction perpendicular to the direction of arrangement of the segments;
- openings formed around each of the segments; and
- tie bars connecting the segment connecting portions and the segments, the tie bars being formed in a direction perpendicular to the axes of the cuts.

25. A semiconductor device comprising a semiconductor element mounted on the semiconductor mount area of the segment of the semiconductor mount substrate according to claim 24, a resin encapsulated portion in which the semiconductor element is encapsulated, and which is formed on the segment, a long main runner extending straight from the substrate peripheral edge along the direction of arrangement of the segments, and a short sub runner branching off from the main runner and reaching the resin encapsulated portion on the segment, wherein the long main runner corresponding to the cut is not joined to the semiconductor mount substrate, while the short sub runner is joined only to the connecting portion and the tie bar.

26. A semiconductor mount substrate provided as a wiring substrate having a plurality of segments arranged at equal intervals in straight rows to form segment groups, a plurality of the segment groups being arranged in parallel with each other, and a segment connecting portion placed around the periphery of each segment group to surround the same, a semiconductor mount area, internal terminals and external terminals being provided on each segment, the semiconductor mount substrate comprising:

- outer connecting portions connecting the segment groups, the outer connecting portions being placed along substrate peripheral edges on opposite sides;
- cuts formed between the segment groups so as to extend from the outer connecting portion on one side to the outer connecting portion on the other side, the cuts being formed along a direction perpendicular to the direction of arrangement of the segments;
- openings formed around each of the segments; and
- tie bars connecting the segment connecting portions and the segments, the tie bars being formed in a direction perpendicular to the axes of the cuts.

27. A semiconductor device comprising a semiconductor element mounted on the semiconductor mount area of the segment of the semiconductor mount substrate according to claim 26, a resin encapsulated portion in which the semiconductor element is encapsulated, and which is formed on the segment, a long main runner extending straight from the substrate peripheral edge along the direction of arrangement of the segments, and a short sub runner branching off from the main runner and reaching the resin encapsulated portion on the segment, wherein the long main runner corresponding to the cut is joined only one side portion of the semiconductor mount substrate, while the short sub runner is joined only to the connecting portion and the tie bar.

* * * * *